(12) United States Patent
Zhang et al.

(10) Patent No.: US 8,970,272 B2
(45) Date of Patent: Mar. 3, 2015

(54) HIGH-SPEED LOW-POWER LATCHES

(75) Inventors: Kun Zhang, Austin, TX (US); Harish Muthali, Round Rock, TX (US)

(73) Assignee: QUALCOMM Incorporated, San Diego, CA (US)

( * ) Notice: Subject to any disclaimer, the term of this patent is extended or adjusted under 35 U.S.C. 154(b) by 308 days.

(21) Appl. No.: 12/121,493

(22) Filed: May 15, 2008

(65) Prior Publication Data
US 2009/0284288 A1 Nov. 19, 2009

(51) Int. Cl.
| H03K 3/356 | (2006.01) |
| H03K 3/017 | (2006.01) |
| H03K 3/3562 | (2006.01) |
| H03K 5/00 | (2006.01) |
| H03K 5/156 | (2006.01) |

(52) U.S. Cl.
CPC .......... *H03K 3/356139* (2013.01); *H03K 3/017* (2013.01); *H03K 3/356121* (2013.01); *H03K 3/35625* (2013.01); *H03K 5/00006* (2013.01); *H03K 5/1565* (2013.01)
USPC .............. 327/208; 327/52; 327/203; 327/218

(58) Field of Classification Search
USPC ......... 327/52, 53, 55, 57, 202, 203, 205, 208, 327/210, 211, 212, 215, 217, 218
See application file for complete search history.

(56) References Cited

U.S. PATENT DOCUMENTS

| 4,061,882 | A | | 12/1977 | Dorren | |
| 4,333,020 | A | * | 6/1982 | Maeder | 327/212 |
| 4,555,777 | A | * | 11/1985 | Poteet | 365/205 |
| 4,623,801 | A | | 11/1986 | Rocchi | |
| 4,716,320 | A | * | 12/1987 | McAdams | 327/52 |

(Continued)

FOREIGN PATENT DOCUMENTS

| CN | 1412947 A | 4/2003 |
| CN | 1904773 A | 1/2007 |

(Continued)

OTHER PUBLICATIONS

Roufoogaran R, et al., "A compact and power efficient local oscillator generation and distribution system for complex multi radio systems" Radio Frequency Integrated Circuits Symposium, 2008. RFIC 2008. IEEE, IEEE, Piscataway, NJ, USA, Jun. 17, 2008, pp. 277-280, XP031284334 ISBN: 978-1-4244-1808-4 *Section 111. Detailed Description*; p. 277-p. 279.

(Continued)

*Primary Examiner* — Jeffrey Zweizig
(74) *Attorney, Agent, or Firm* — Kevin T. Cheatham

(57) ABSTRACT

A high-speed low-power latch includes three sets of transistors. A first set of transistors selects a tracking mode or a holding mode for the latch based on a clock signal having non-rail-to-rail or rail-to-rail voltage swing. A second set of transistors captures a data value based on an input signal and provides an output signal during the tracking mode. A third set of transistors stores the data value and provides the output signal during the holding mode. The input and output signals have rail-to-rail voltage swing. In another aspect, a signal generator includes at least one latch and a control circuit. The latch(es) receive a clock signal and generate an output signal. The control circuit senses a duty cycle of a feedback signal derived from the output signal and generates a control signal to adjust operation of the latch(es) to obtain 50% duty cycle for the feedback signal.

47 Claims, 8 Drawing Sheets

(56) References Cited

U.S. PATENT DOCUMENTS

| | | |
|---|---|---|
| 4,959,557 A | 9/1990 | Miller |
| 4,995,589 A | 2/1991 | Adishian et al. |
| 5,097,157 A * | 3/1992 | Jaffe et al. ............... 327/55 |
| 5,103,114 A | 4/1992 | Fitch |
| 5,103,116 A | 4/1992 | Sivilotti et al. |
| 5,103,144 A | 4/1992 | Dunham |
| 5,192,875 A | 3/1993 | Kielmeyer, Jr. |
| 5,375,258 A | 12/1994 | Gillig |
| 5,477,180 A | 12/1995 | Chen |
| 5,534,803 A | 7/1996 | Correale, Jr. et al. |
| 5,682,109 A * | 10/1997 | Ohmi et al. ............... 327/57 |
| 5,708,399 A | 1/1998 | Fujii et al. |
| 5,983,082 A | 11/1999 | Hilbert |
| 5,994,935 A | 11/1999 | Ueda et al. |
| 6,014,047 A | 1/2000 | Dreps et al. |
| 6,037,816 A | 3/2000 | Yamauchi |
| 6,057,823 A | 5/2000 | Aoki et al. |
| 6,166,571 A | 12/2000 | Wang |
| 6,169,434 B1 | 1/2001 | Portmann |
| 6,188,291 B1 | 2/2001 | Gopinathan et al. |
| 6,191,629 B1 | 2/2001 | Bisanti et al. |
| 6,239,640 B1 | 5/2001 | Liao et al. |
| 6,310,501 B1 | 10/2001 | Yamashita |
| 6,316,987 B1 | 11/2001 | Dally et al. |
| 6,320,418 B1 | 11/2001 | Fujii et al. |
| 6,320,438 B1 | 11/2001 | Arcus |
| 6,420,921 B1 | 7/2002 | Okayasu et al. |
| 6,426,660 B1 | 7/2002 | Ho et al. |
| 6,433,589 B1 | 8/2002 | Lee |
| 6,542,015 B2 | 4/2003 | Zhou et al. |
| 6,593,789 B2 | 7/2003 | Atallah et al. |
| 6,661,269 B2 | 12/2003 | Simon et al. |
| 6,667,703 B1 | 12/2003 | Reuveni et al. |
| 6,674,772 B1 | 1/2004 | Dally et al. |
| 6,831,497 B2 | 12/2004 | Koh et al. |
| 6,836,240 B1 | 12/2004 | Dubbert et al. |
| 6,897,696 B2 | 5/2005 | Chang |
| 6,904,538 B2 | 6/2005 | Glas et al. |
| 6,933,759 B1 | 8/2005 | Wu et al. |
| 6,967,514 B2 | 11/2005 | Kizer et al. |
| 6,995,589 B2 | 2/2006 | Chen et al. |
| 7,027,793 B2 | 4/2006 | Gard et al. |
| 7,075,377 B2 | 7/2006 | Metaxakis |
| 7,099,643 B2 | 8/2006 | Lin |
| 7,110,469 B2 | 9/2006 | Shi et al. |
| 7,184,512 B2 | 2/2007 | Takeshita et al. |
| 7,239,209 B2 | 7/2007 | Adan |
| 7,271,622 B2 | 9/2007 | Metaxakis |
| 7,298,222 B2 | 11/2007 | Rosik et al. |
| 7,307,461 B2 | 12/2007 | Nguyen et al. |
| 7,315,220 B1 | 1/2008 | Robinson et al. |
| 7,323,944 B2 | 1/2008 | Florescu et al. |
| 7,336,114 B2 | 2/2008 | Razavi et al. |
| 7,352,229 B1 | 4/2008 | Mei et al. |
| 7,388,416 B2 | 6/2008 | Marutani |
| 7,423,468 B2 | 9/2008 | Cho |
| 7,457,605 B2 | 11/2008 | Thompson et al. |
| 7,474,715 B1 | 1/2009 | Ni et al. |
| 7,521,976 B1 | 4/2009 | Sudjian et al. |
| 7,545,230 B2 | 6/2009 | Jang et al. |
| 7,554,380 B2 | 6/2009 | Embabi et al. |
| 7,580,483 B2 | 8/2009 | Ibrahim et al. |
| 7,603,094 B2 | 10/2009 | Rahman et al. |
| 7,616,938 B2 | 11/2009 | Behzad et al. |
| 7,619,456 B2 | 11/2009 | Kim et al. |
| 7,656,205 B2 | 2/2010 | Chen et al. |
| 7,683,682 B1 | 3/2010 | Won et al. |
| 7,693,230 B2 | 4/2010 | Sorrells et al. |
| 7,715,836 B2 | 5/2010 | Vassiliou et al. |
| 7,750,708 B2 | 7/2010 | Gschier |
| 7,750,749 B2 | 7/2010 | Jones |
| 7,768,330 B2 | 8/2010 | Yuuki et al. |
| 7,808,329 B2 | 10/2010 | Azadet et al. |
| 7,821,315 B2 | 10/2010 | Bossu et al. |
| 7,932,844 B1 | 4/2011 | Huynh et al. |
| 7,965,111 B2 | 6/2011 | Sun et al. |
| 8,095,103 B2 | 1/2012 | Asuri |
| 8,164,361 B2 | 4/2012 | Soltanian et al. |
| 8,248,132 B2 | 8/2012 | Chang |
| 8,615,205 B2 | 12/2013 | Choksi et al. |
| 2001/0050583 A1 | 12/2001 | Fulkerson |
| 2002/0000834 A1 | 1/2002 | Ooishi |
| 2002/0079938 A1 | 6/2002 | Saeki |
| 2002/0113270 A1 | 8/2002 | Bernstein et al. |
| 2002/0160740 A1 | 10/2002 | Hatcher et al. |
| 2003/0042957 A1 | 3/2003 | Tamura |
| 2003/0042989 A1 | 3/2003 | Sakurai |
| 2003/0102926 A1 | 6/2003 | Hsieh |
| 2004/0008092 A1 | 1/2004 | Hajimiri et al. |
| 2004/0036541 A1 | 2/2004 | Fang et al. |
| 2004/0051397 A1 | 3/2004 | Juntunen et al. |
| 2004/0147238 A1 | 7/2004 | Wang et al. |
| 2004/0212741 A1 | 10/2004 | Hijikata et al. |
| 2005/0024097 A1 | 2/2005 | Sim et al. |
| 2005/0046494 A1 | 3/2005 | Lee et al. |
| 2005/0122149 A1 | 6/2005 | Cho et al. |
| 2005/0174157 A1 | 8/2005 | Calo et al. |
| 2006/0035617 A1 | 2/2006 | Kim |
| 2006/0059376 A1 | 3/2006 | Ngo et al. |
| 2006/0067424 A1 | 3/2006 | Wolf |
| 2006/0119446 A1 | 6/2006 | Li |
| 2007/0037544 A1 | 2/2007 | Heikkinen |
| 2007/0076832 A1 | 4/2007 | Matsudera |
| 2007/0239319 A1 | 10/2007 | Inukai et al. |
| 2007/0242548 A1 | 10/2007 | Tonti et al. |
| 2007/0257742 A1 | 11/2007 | Cha et al. |
| 2007/0273485 A1 | 11/2007 | Balachandran et al. |
| 2007/0285120 A1 | 12/2007 | Venditti et al. |
| 2008/0001645 A1 | 1/2008 | Kuroki |
| 2008/0032646 A1 | 2/2008 | Huang et al. |
| 2008/0048736 A1 | 2/2008 | Ruy |
| 2008/0061894 A1 | 3/2008 | Raita et al. |
| 2008/0074148 A1 | 3/2008 | Srivastava et al. |
| 2008/0096508 A1 | 4/2008 | Luff |
| 2008/0106313 A1 | 5/2008 | Keady et al. |
| 2008/0116902 A1 | 5/2008 | Kim et al. |
| 2008/0132195 A1 | 6/2008 | Maxim et al. |
| 2008/0180139 A1 | 7/2008 | Natonio et al. |
| 2008/0225169 A1 | 9/2008 | Takita et al. |
| 2008/0231379 A1 | 9/2008 | Jang et al. |
| 2008/0258781 A1 | 10/2008 | Song et al. |
| 2009/0033430 A1 | 2/2009 | Jang et al. |
| 2009/0066157 A1 | 3/2009 | Tarng et al. |
| 2009/0102520 A1 | 4/2009 | Lee et al. |
| 2009/0108885 A1 | 4/2009 | Natonio et al. |
| 2009/0131006 A1 | 5/2009 | Wu |
| 2009/0154595 A1 | 6/2009 | Choksi et al. |
| 2009/0156135 A1 | 6/2009 | Kamizuma et al. |
| 2009/0184741 A1 | 7/2009 | Suda et al. |
| 2009/0256596 A1 | 10/2009 | Oh |
| 2009/0284288 A1 | 11/2009 | Zhang et al. |
| 2009/0284311 A1 | 11/2009 | Ito |
| 2009/0310711 A1 | 12/2009 | Chiu et al. |
| 2010/0012648 A1 | 1/2010 | Gustafsson et al. |
| 2010/0120390 A1 | 5/2010 | Panikkath et al. |
| 2010/0130139 A1 | 5/2010 | Panikkath et al. |
| 2010/0194485 A1 | 8/2010 | Chawla et al. |
| 2010/0198540 A1 | 8/2010 | Yanagisawa et al. |
| 2010/0226459 A1 | 9/2010 | Park et al. |
| 2011/0001522 A1 | 1/2011 | Chan et al. |
| 2011/0012648 A1 | 1/2011 | Qiao et al. |
| 2011/0043291 A1 | 2/2011 | Fagg |
| 2011/0050296 A1 | 3/2011 | Fagg |
| 2011/0181330 A1 | 7/2011 | Oh |
| 2013/0012150 A1 | 1/2013 | Panikkath et al. |
| 2013/0271188 A1 | 10/2013 | Chan |
| 2013/0328707 A1 | 12/2013 | Choksi et al. |
| 2013/0336143 A1 | 12/2013 | Choksi et al. |

FOREIGN PATENT DOCUMENTS

| | | |
|---|---|---|
| EP | 0398751 A2 | 11/1990 |
| EP | 0637134 A1 | 2/1995 |
| EP | 0872956 A2 | 10/1998 |

(56) References Cited

FOREIGN PATENT DOCUMENTS

| | | |
|---|---|---|
| EP | 1345317 A2 | 9/2003 |
| EP | 1394944 | 3/2004 |
| EP | 1416691 A1 | 5/2004 |
| EP | 1655591 A1 | 5/2006 |
| EP | 1679796 A1 | 7/2006 |
| EP | 2294691 A2 | 3/2011 |
| FR | 2670975 A1 | 6/1992 |
| GB | 2321144 A | 7/1998 |
| JP | 53048401 A | 5/1978 |
| JP | 59008112 A | 1/1984 |
| JP | 62141219 U | 9/1987 |
| JP | 63078610 A | 4/1988 |
| JP | H0194723 A | 4/1989 |
| JP | H01314013 A | 12/1989 |
| JP | 2058951 A | 2/1990 |
| JP | 2060330 U | 5/1990 |
| JP | 2131615 A | 5/1990 |
| JP | H03262317 A | 11/1991 |
| JP | H04152711 A | 5/1992 |
| JP | H05235746 A | 9/1993 |
| JP | 5268000 A | 10/1993 |
| JP | 7170162 A | 7/1995 |
| JP | 9046195 A | 2/1997 |
| JP | 9191238 A | 7/1997 |
| JP | H09284125 A | 10/1997 |
| JP | 10111674 A | 4/1998 |
| JP | 10247842 A | 9/1998 |
| JP | H11298077 A | 10/1999 |
| JP | 2000295090 A | 10/2000 |
| JP | 2000332583 A | 11/2000 |
| JP | 2001245007 A | 9/2001 |
| JP | 2001312328 A | 11/2001 |
| JP | 2001313228 A | 11/2001 |
| JP | 2002043900 A | 2/2002 |
| JP | 2002064367 A | 2/2002 |
| JP | 2003101397 A | 4/2003 |
| JP | 2003512752 A | 4/2003 |
| JP | 2003224471 A | 8/2003 |
| JP | 2004129255 A | 4/2004 |
| JP | 2004531126 A | 10/2004 |
| JP | 2004336822 A | 11/2004 |
| JP | 2005110080 A | 4/2005 |
| JP | 2006093748 A | 4/2006 |
| JP | 2006115148 A | 4/2006 |
| JP | 2006173897 A | 6/2006 |
| JP | 2006217563 A | 8/2006 |
| JP | 2006287819 A | 10/2006 |
| JP | 2006314029 A | 11/2006 |
| JP | 2007102483 A | 4/2007 |
| JP | 2008029008 A | 2/2008 |
| JP | 2008054134 A | 3/2008 |
| JP | 2008124836 A | 5/2008 |
| JP | 2010003925 A | 1/2010 |
| KR | 20050055925 A | 6/2005 |
| KR | 100791934 B1 | 1/2008 |
| KR | 20080019156 A | 3/2008 |
| TW | 200305312 A | 10/2003 |
| TW | 200529566 | 9/2005 |
| TW | 200723676 | 6/2007 |
| TW | I283515 B | 7/2007 |
| WO | WO9621270 A1 | 7/1996 |
| WO | WO9912259 A2 | 3/1999 |
| WO | WO0129965 A1 | 4/2001 |
| WO | WO0251091 A1 | 6/2002 |
| WO | 02052691 A1 | 7/2002 |
| WO | WO-2004047324 A1 | 6/2004 |
| WO | WO2006033203 A1 | 3/2006 |
| WO | WO2009036397 | 3/2009 |
| WO | WO2009036399 | 3/2009 |
| WO | WO-2009140656 A2 | 11/2009 |
| WO | WO2010068504 | 6/2010 |

OTHER PUBLICATIONS

Chan, et al., "Hercules (RTR8700) Divider", Aug. 2005.
Chan, "Hercules (RTR8700) Divider", Aug. 2005.
Navid S et al., "Level-Locked Loop: A Technique for Broadband Quadrature Signal Generation", Custom Integrated Circuits Conference, 1997. Proceedings of the IEEE 1997 Santa Clara, CA, USA May 5-8, 1997, New York, NY, USA, IEEE, US, May 5, 1997, pp. 411-414, XP010235334, DOI: 10.1109/CICC.1997.606656 ISBN: 978-0-7803-3669-8.
Co-pending US patent application No. US13/011,716, filed on 2011-01-21.
Taiwan Search Report—TW098116316—TIPO—Jun. 6, 2012.
Lee, T.H., et al., "A 2.5 V CMOS delay-locked loop for 18 Mbit, 500 megabyte/s DRAM," Solid-State Circuits, IEEE Journal of, vol. 29, No. 12, pp. 1491-1496, Dec. 1994.
International Search Report and Written Opinion—PCT/US2009/044242, International Search Authority—European Patent Office—Nov. 26, 2009.
Fuse, T et al: "A 1.1V SOI CMOS Frequency Divider Using Body-Inputting SCL Circuit Technology", 2000 IEEE International SOI Conference Proceedings. Wakefield, MA, Oct. 2-5, 2000; [IEEE International SOI Conference], New York, NY : IEEE, US, Oct. 2, 2000, p. 106/107, XP001003452, ISBN: 978-0/7803-6390-8 p. 106; figure 3.
MCGraw-Hill Dictionary of Scientific and Technical Terms, Sixth Edition, 2003, pp. 1428-1429.

* cited by examiner

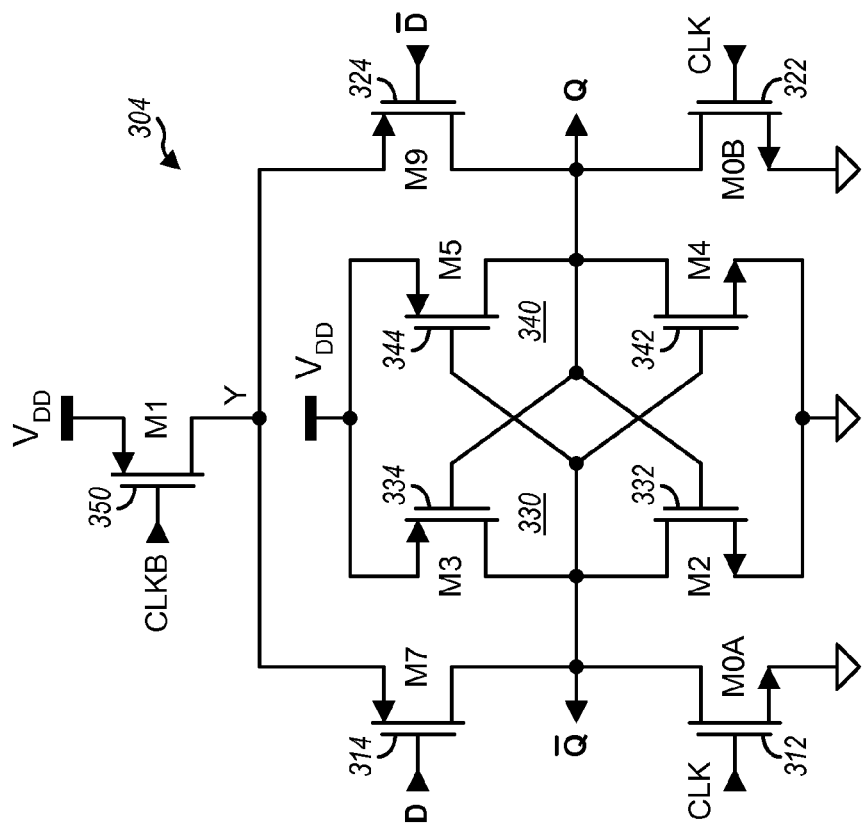
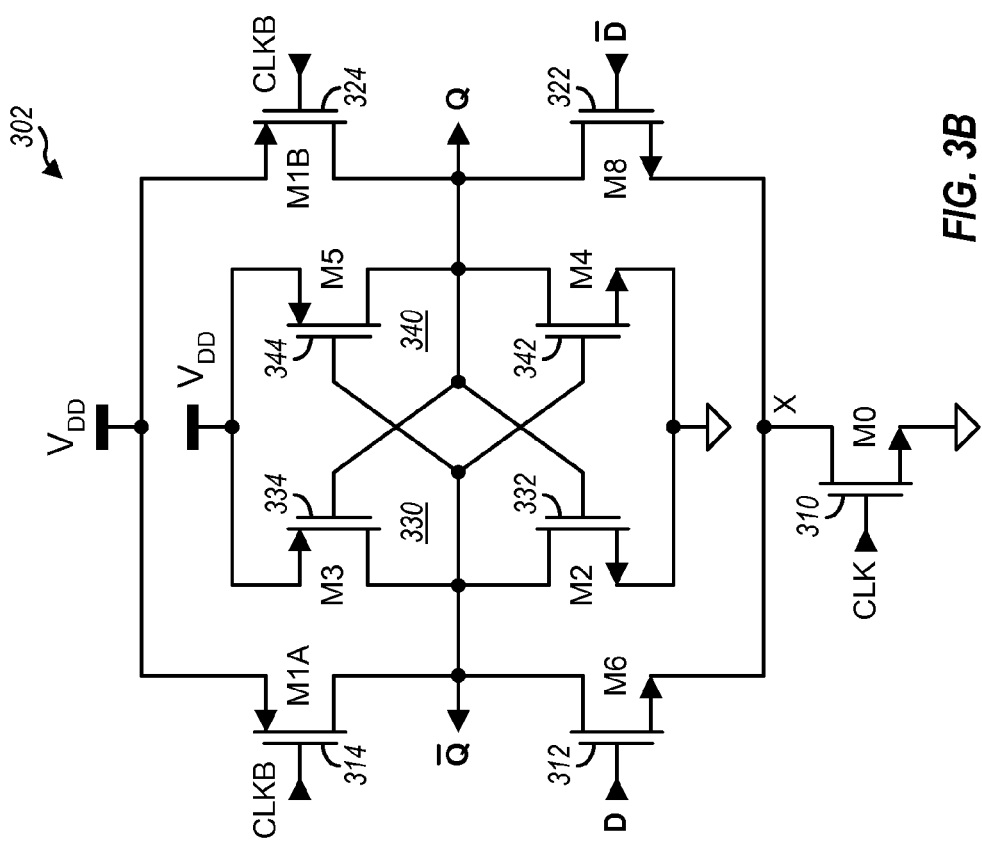
FIG. 3C
FIG. 3B

HIGH-SPEED LOW-POWER LATCHES

BACKGROUND

I. Field

The present disclosure relates generally to electronics, and more specifically to latches.

II. Background

A latch is a circuit that can store one bit of information and can be controlled by a clock signal or some other control signal. A latch may have two operating modes, a tracking mode and a holding mode, which may be selected by the clock signal. These operating modes may also be referred to by other names. The output of the latch may follow an input signal during the tracking mode, e.g., when the clock signal is at logic high. A data value may be captured by the latch, e.g., when the clock signal transitions to logic low. The captured value may be retained and provided to the latch output during the holding mode, e.g., when the clock signal is at logic low. A latch may also be triggered by low logic, rising edge, or falling edge of a clock signal.

Latches are commonly used in various circuits and applications. For example, latches may be used in frequency dividers, which are often used in receivers and transmitters. A frequency divider may receive a VCO signal from a voltage controlled oscillator (VCO), divide the VCO signal in frequency by a factor of N, and provide a divider signal having a frequency that is 1/N-th the frequency of the VCO signal, where N may be an integer or non-integer value. Since the VCO signal may be at a high frequency, high-speed latches that consume low power are highly desirable.

SUMMARY

High-speed low-power latches that may be used for various circuits and applications are described herein. In an aspect, a high-speed low-power latch includes first, second and third sets of transistors. The first set of transistors selects a tracking mode or a holding mode for the latch based on a clock signal having non-rail-to-rail or rail-to-rail voltage swing. The second set of transistors captures a data value based on an input signal and provides an output signal during the tracking mode. The third set of transistors stores the data value and provides the output signal during the holding mode. The input and output signals have rail-to-rail voltage swing. The clock signal and the input and output signals may be differential signals.

In one design, the first set includes at least one pull-down transistor and/or at least one pull-up transistor that are enabled or disabled based on the clock signal. In one design, the second set includes first and second switching transistors that receive non-inverted and inverted input signals, respectively, and provide inverted and non-inverted output signals, respectively. The second set may include additional switching transistors. In one design, the third set includes first and second latching transistors coupled as a first inverter and third and four latching transistors coupled as a second inverter. The first and second inverters are cross-coupled.

In another aspect, a frequency divider includes multiple latches coupled in series. Each latch receives a clock signal having non-rail-to-rail voltage swing and provides an output signal having rail-to-rail voltage swing. The multiple latches divide the clock signal in frequency and provide a divider signal having a frequency that is a fraction of the frequency of the clock signal.

In yet another aspect, a signal generator includes at least one latch and a control circuit that performs automatic duty cycle adjustment. The at least one latch receives a clock signal and generates an output signal. The control circuit senses a duty cycle of a feedback signal derived from the output signal. The control circuit then generates a control signal to adjust the operation of the at least one latch to obtain 50% duty cycle for the feedback signal. In one design, the signal generator further includes a bias circuit that receives an oscillator signal and provides the clock signal. The control circuit provides a bias voltage as the control signal, and the clock signal has a direct current (DC) level determined by the bias voltage. The duty cycle may be adjusted by turning on at least one transistor in the at least one latch either stronger or weaker based on the DC level of the clock signal.

Various aspects and features of the disclosure are described in further detail below.

BRIEF DESCRIPTION OF THE DRAWINGS

FIGS. 3A to 3E show schematic diagrams of five designs of high-speed low-power latches.

DETAILED DESCRIPTION

The high-speed low-power latches described herein may be used for various circuits and applications. For clarity, an exemplary use of the high-speed low-power latches in a frequency divider is described below.

Figure 1:
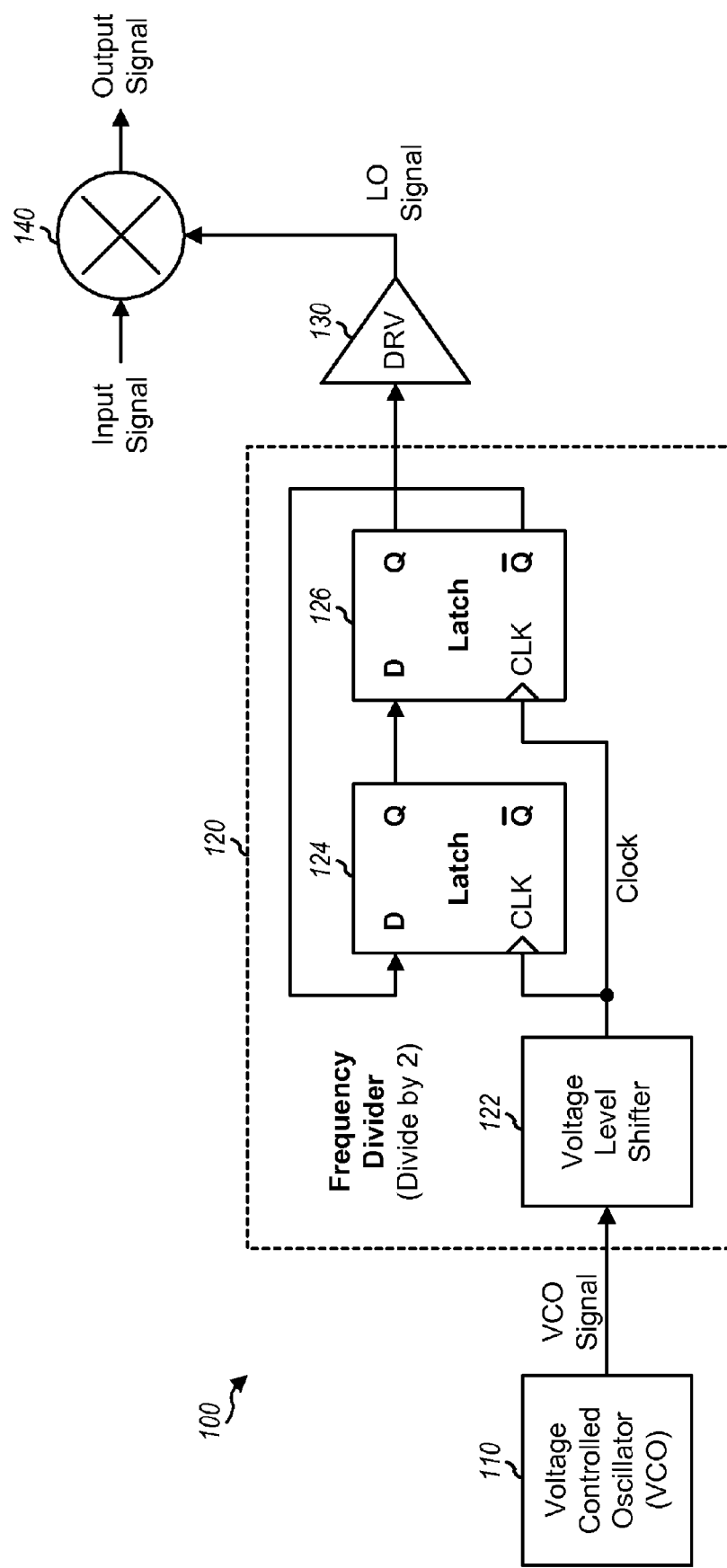
FIG. 1 shows a block diagram of a local oscillator (LO) signal generator.

FIG. 1 shows a block diagram of a design of an LO signal generator 100, which may be part of a receiver or a transmitter. Within LO signal generator 100, a VCO 110 generates a VCO signal at a frequency of $f_0$. A frequency divider 120 divides the VCO signal by two in frequency and provides a divider signal having a frequency of $f_0/2$. Within frequency divider 120, a voltage level shifter 122 receives the VCO signal, shifts the DC level and/or varies the amplitude of the VCO signal, and provides a clock signal. Latches 124 and 126 are coupled in series. Latch 124 has its data input coupled to an inverted data output of latch 126 and its clock input receiving the clock signal. Latch 126 has its data input coupled to a data output of latch 126, its clock input receiving the clock signal, and its data output providing the divider signal. A driver (DRV) 130 receives the divider signal and provides an LO signal to a mixer 140. For a transmitter, mixer 140 upconverts a baseband input signal with the LO signal and provides an upconverted output signal. For a receiver, mixer 140 downconverts a radio frequency (RF) input signal with the LO signal and provides a downconverted output signal.

High-speed frequency dividers, such as frequency divider 120 in FIG. 1, are commonly used in communication systems and typically consume large amount of power. In many communication systems, frequency dividers are used to divide VCO signals and generate LO signals for mixers, e.g., as shown in FIG. 1. The VCO signals typically have non-rail-to-rail voltage swing whereas the LO signals typically have rail-to-rail voltage swing. Rail-to-rail voltage swing refers to voltage swing between an upper ($V_{DD}$) supply voltage and a lower ($V_{SS}$) supply voltage, which may be circuit ground. Non-rail-to-rail voltage swing refers to voltage swing over a fraction of the range from $V_{DD}$ to $V_{SS}$.

Most conventional latches operate with the same input and output voltage swing. For example, a CML latch receives a non-rail-to-rail clock signal and generates a non-rail-to-rail output signal. A CMOS static latch receives a rail-to-rail clock signal and generates a rail-to-rail output signal. A voltage level shifter may be used to convert a non-rail-to-rail signal to a rail-to-rail signal. For example, the voltage level shifter may convert a non-rail-to-rail VCO signal to a rail-to-rail clock signal for a CMOS static latch, as shown in FIG. 1. Alternatively, the voltage level shifter may convert a non-rail-to-rail output signal from a CML latch to a rail-to-rail divider signal (not shown in FIG. 1). In any case, the voltage level shifter typically consumes a large amount of power, especially at high frequency.

Figure 2B:
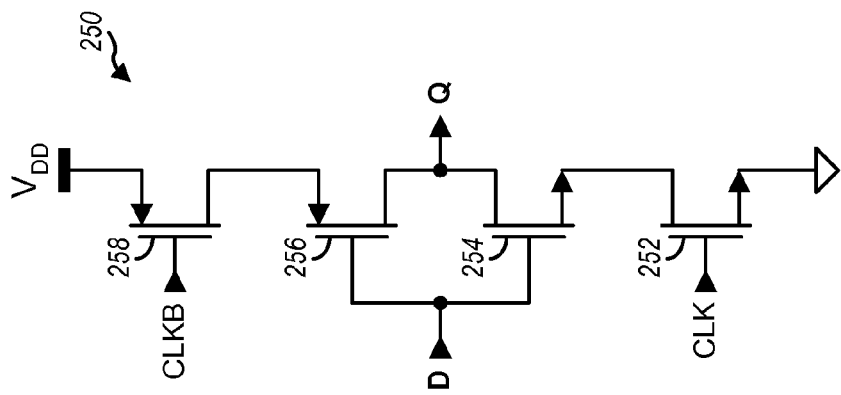
FIGS. 2A and 2B show schematic diagrams of a conventional current mode logic (CML) latch and a conventional complementary metal oxide semiconductor (CMOS) static latch, respectively.
Figure 2A:
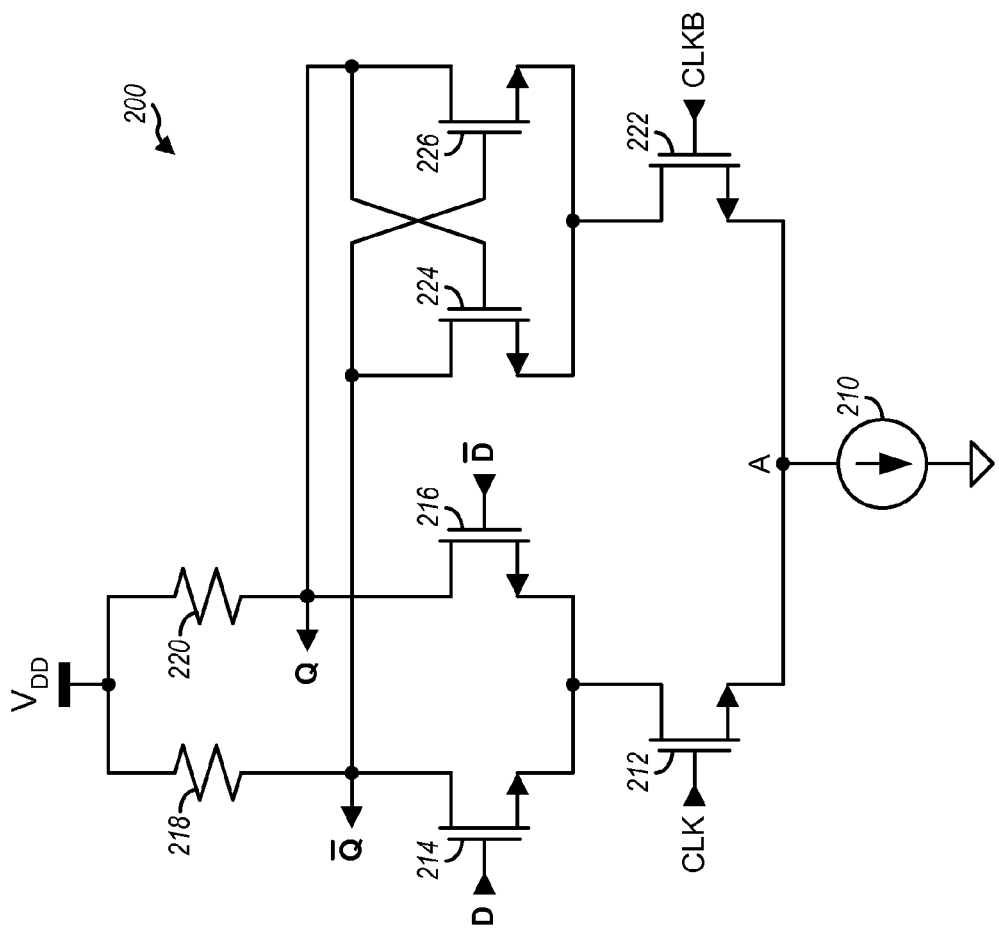

FIG. 2A shows a schematic diagram of a conventional CML latch 200, which may be used for a frequency divider. Within conventional CML latch 200, N-channel metal oxide semiconductor (NMOS) transistors 212 and 222 have their sources coupled to node A and their gates coupled to a clock (CLK) input and an inverted clock (CLKB) input, respectively. A current source 210 is coupled between node A and circuit ground.

NMOS transistors 214 and 216 have their sources coupled to the drain of NMOS transistor 212, their gates coupled to a data (D) input and an inverted data ($\overline{D}$) input, respectively, and their drains coupled to an inverted data ($\overline{Q}$) output and a data (Q) output, respectively. NMOS transistors 224 and 226 have their sources coupled to the drain of NMOS transistor 222, their gates coupled to the Q and $\overline{Q}$ outputs, respectively, and their drains coupled to the $\overline{Q}$ and Q outputs, respectively. A resistor 218 is coupled between the $V_{DD}$ supply and the $\overline{Q}$ output, and a resistor 228 is coupled between the $V_{DD}$ supply and the Q output.

Conventional CML latch 200 operates as follows. In the tracking mode, NMOS transistor 212 is turned on, NMOS transistor 222 is turned off, and the voltages at the Q and $\overline{Q}$ outputs are determined by a differential input signal on the D and $\overline{D}$ inputs. In the holding mode, NMOS transistor 212 is turned off, NMOS transistor 222 is turned on, and NMOS transistors 224 and 226 maintain the voltages at the Q and $\overline{Q}$ outputs. Current source 210 provides bias current for either NMOS transistors 214 and 216 or NMOS transistors 224 and 226 at any given moment. CML latch 200 thus consumes power all the time. A differential clock signal at the CLK and CLKB inputs, a differential input signal at the D and $\overline{D}$ inputs, and a differential output signal at the Q and $\overline{Q}$ outputs of conventional CML latch 200 are non-rail-to-rail signals. For example, with a 1.3 Volts (V) supply voltage, the clock signal may range from 0.3 to 1.0V, and the input and output signals may range from 0.8 to 1.3V.

Conventional CML latch 200 has several disadvantages. First, conventional CML latch 200 accepts a non-rail-to-rail clock signal and provides a non-rail-to-rail output signal. A voltage level shifter is needed to convert the non-rail-to-rail output signal to a rail-to-rail output signal. Second, conventional CML latch 200 consumes high power for good performance.

FIGS. 2A and 2B illustrate an instance of signals present in the prior art DPLL 10 during operation.

Within conventional CMOS static latch 250, an NMOS transistor 252 has its source coupled to circuit ground and its gate coupled to a clock input. An NMOS transistor 254 has its source coupled to the drain of NMOS transistor 252, its gate coupled to a data input, and its drain coupled to a data output. A P-channel MOS (PMOS) transistor 256 has its gate coupled to the data input and its drain coupled to the data output. A PMOS transistor 258 has its source coupled to the VDD supply, its gate coupled to an inverted clock input, and its drain coupled to the source of PMOS transistor 256.

Conventional CMOS static latch 250 operates as follows. In the tracking mode, MOS transistors 252 and 258 are turned on, and an output signal at the Q output is determined by an input signal at the D input. In the holding mode, MOS transistors 252 and 258 are turned off, and the output signal is maintained by a capacitive load at the Q output. conventional CMOS static latch 250 may not be operable at low frequency due to leakage current in the capacitive load.

Conventional CMOS static latch 250 has several disadvantages. First, CMOS static latch 250 accepts a rail-to-rail clock signal. A voltage level shifter is needed to convert a non-rail to-rail rail VCO signal to a rail-to-rail clock signal, as shown in FIG. 1. Second, conventional CMOS static latch 250 generates a single-ended output signal, and some applications require a differential output signal.

In an aspect, high-speed low-power latches that can accept a non-rail-to-rail or rail-to-rail clock signal and provide a rail-to-rail differential output signal are described herein. No voltage level shifter is needed for these latches. Several designs of the high-speed low-power latches are described below.

Figure 3A:
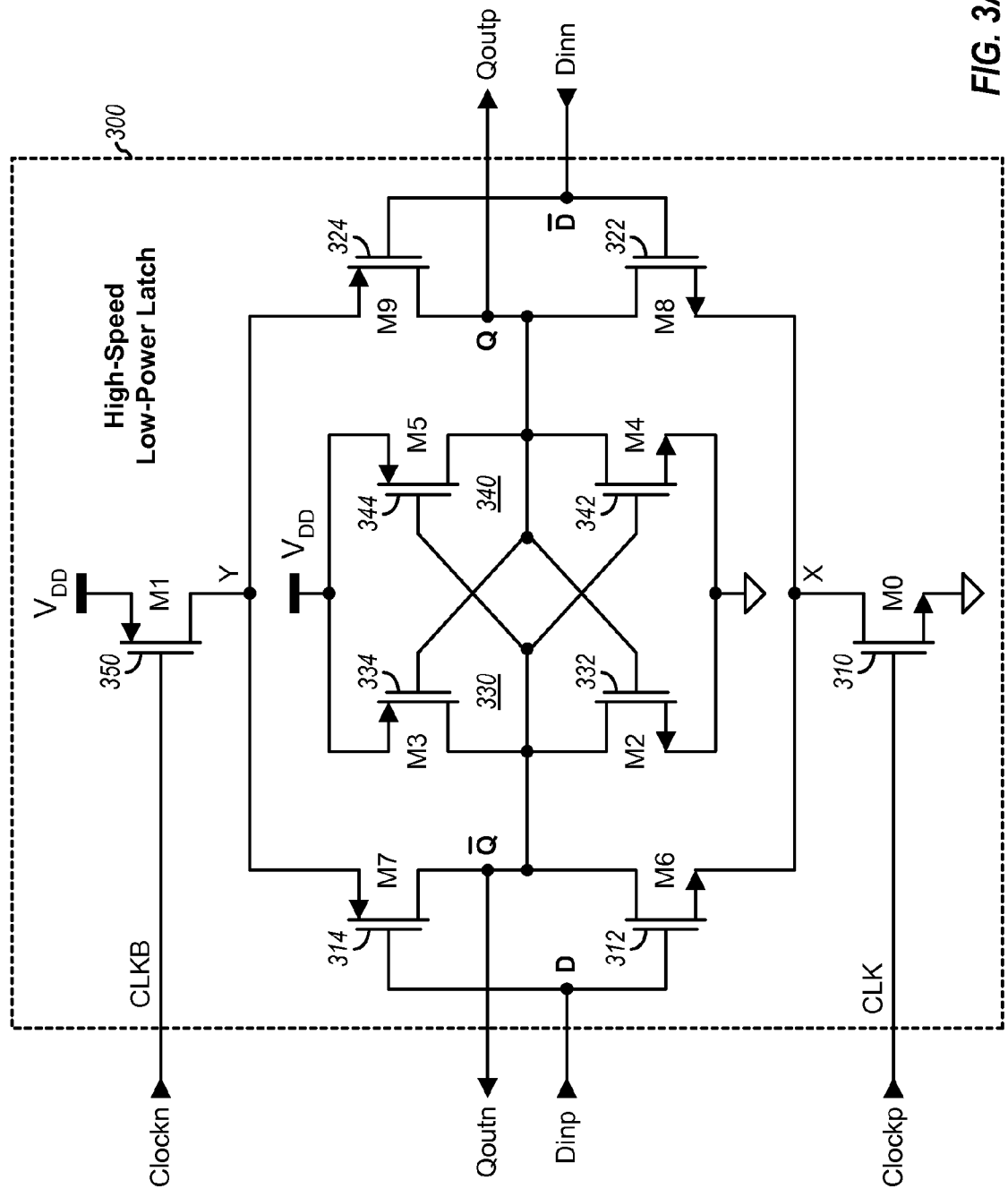

FIG. 3A shows a schematic diagram of a design of a high-speed low-power latch 300. Within latch 300, an NMOS transistor M0 310 has its source coupled to circuit ground, its gate coupled to a CLK input, and its drain coupled to node X. An NMOS transistor M6 312 has its source coupled to node X, its gate coupled to a D input, and its drain coupled to a $\overline{Q}$ output. A PMOS transistor M7 314 has its source coupled to node Y, its gate coupled to the D input, and its drain coupled to the $\overline{Q}$ output. An NMOS transistor M8 322 has its source coupled to node X, its gate coupled to a $\overline{D}$ input, and its drain coupled to a Q output. A PMOS transistor M9 324 has its source coupled to node Y, its gate coupled to the $\overline{D}$ input, and its drain coupled to the Q output. A PMOS transistor M1 350 has its source coupled to the $V_{DD}$ supply, its gate coupled to the CLKB input, and its drain coupled to node Y.

An NMOS transistor M2 332 and a PMOS transistor M3 334 are coupled as an inverter 330 and have their gates coupled together and to the Q output, their drains coupled together and to the $\overline{Q}$ output, and their sources coupled to circuit ground and the $V_{DD}$ supply, respectively. An NMOS transistor M4 342 and a PMOS transistor M5 344 are coupled as an inverter 340 and have their gates coupled together and to the $\overline{Q}$ output, their drains coupled together and to the Q output, and their sources coupled to circuit ground and the $V_{DD}$ supply, respectively. Inverters 330 and 340 are cross-coupled, and each inverter has its output coupled to the input of the other inverter.

Latch 300 receives a differential clock signal composed of a non-inverted clock (Clockp) signal and an inverted clock (Clockn) signal at the CLK and CLKB inputs, respectively. The Clockp and Clockn signals are also referred to as complementary clock signals. The Clockp and Clockn signals may have non-rail-to-rail or rail-to-rail voltage swing and may also have the same or different DC levels. Latch 300 also receives a differential input signal composed of a non-inverted input (Dinp) signal and an inverted input (Dinn) signal at the D and $\overline{D}$ inputs, respectively. Latch 300 provides a differential output signal composed of a non-inverted output (Qoutp) signal and an inverted output (Qoutn) signal at the Q and $\overline{Q}$ outputs, respectively. The complementary input signals and the complementary output signals may have rail-to-rail voltage swing.

Latch 300 includes the following three sets of transistors:
A first set of pull-down transistor M0 and pull-up transistor M1,
A second set of switching transistors M6 to M9, and
A third set of latching transistors M2 to M5.

Latch 300 operates as follows. When the CLK input is high during the tracking mode, the pull-down and pull-up transistors M0 and M1 are turned on and are stronger than the latching transistors M2 to M5. The switching transistors M6 to M9 set the Q and $\overline{Q}$ outputs according to the complementary input signals at the D and $\overline{D}$ inputs. The latching transistors amplify the voltages at the Q and $\overline{Q}$ outputs to rail-to-rail level. The Q and $\overline{Q}$ outputs thus track the voltages on the D and $\overline{D}$ inputs during the tracking mode. The latching transistors capture the data value at the Q and $\overline{Q}$ outputs when the CLK input transitions from high to low. When the CLK input is low during the holding mode, the pull-down and pull-up transistors M0 and M1 are partially turned off and are weaker than the latching transistors. The latching transistors then maintain the Q and $\overline{Q}$ outputs in accordance with the captured data value.

The first set of pull-down and pull-up transistors thus controls whether latch 300 operates in the tracking mode or the holding mode based on the clock signal. The second set of switching transistors determines a data value for latch 300 based on the input signal during the tracking mode. The third set of latching transistors provides signal amplification during the tracking mode and stores the data value during the holding mode. The second set of switching transistors provides the output signal during the tracking mode, and the third set of latching transistors provides the output signal during the holding mode.

FIG. 3B shows a schematic diagram of a design of a high-speed low-power latch 302. Within latch 302, MOS transistors 310 through 344 are coupled as described above for FIG. 3A with the following differences. PMOS transistor M1A 314 has its gate coupled to the CLKB input and its source coupled to the $V_{DD}$ supply. PMOS transistor M1B 324 has its gate coupled to the CLKB input and its source coupled to the $V_{DD}$ supply. PMOS transistor 350 is omitted in latch 302.

Latch 302 includes the following three sets of transistors:
A first set of pull-down transistor M0 and pull-up transistors M1A and M1B,
A second set of switching transistors M6 and M8, and
A third set of latching transistors M2 to M5.

Latch 302 operates in similar manner as latch 300 in FIG. 3A. When the CLK input is high during the tracking mode, the pull-down and pull-up transistors M0, M1A and M1B are turned on and are stronger than the latching transistors M2 to M5. The Q and $\overline{Q}$ outputs are set by the switching transistors M6 and M8 according to the complementary input signals at the D and $\overline{D}$ inputs and are amplified by the latching transistors to rail-to-rail level. The latching transistors capture the data value at the Q and $\overline{Q}$ outputs when the CLK input transitions from high to low. The latching transistors maintain the Q and $\overline{Q}$ outputs in accordance with the captured data value during the holding mode when the CLK input is low.

FIG. 3C shows a schematic diagram of a design of a high-speed low-power latch 304. Within latch 304, MOS transistors 312 through 350 are coupled as described above for FIG. 3A with the following differences. NMOS transistor M0A 312 and NMOS transistor M0B 322 have their gates coupled to the CLK input and their sources coupled to circuit ground. NMOS transistor 310 is omitted in latch 304.

Latch 304 includes the following three sets of transistors:
A first set of pull-down transistors M0A and M0B and pull-up transistor M1,
A second set of switching transistors M7 and M9, and
A third set of latching transistors M2 to M5.

Latch 304 operates in similar manner as latch 300 in FIG. 3A. When the CLK input is high during the tracking mode, the pull-down and pull-up transistors M0A, M0B and M1 are turned on and are stronger than the latching transistors M2 to M5. The Q and $\overline{Q}$ outputs are set by the switching transistors M7 and M9 according to the complementary input signals at the D and $\overline{D}$ inputs and are amplified by the latching transistors to rail-to-rail level. The latching transistors capture the data value at the Q and $\overline{Q}$ outputs when the CLK input transitions from high to low. The latching transistors maintain the Q and $\overline{Q}$ outputs in accordance with the captured data value during the holding mode when the CLK input is low.

Figure 3E:
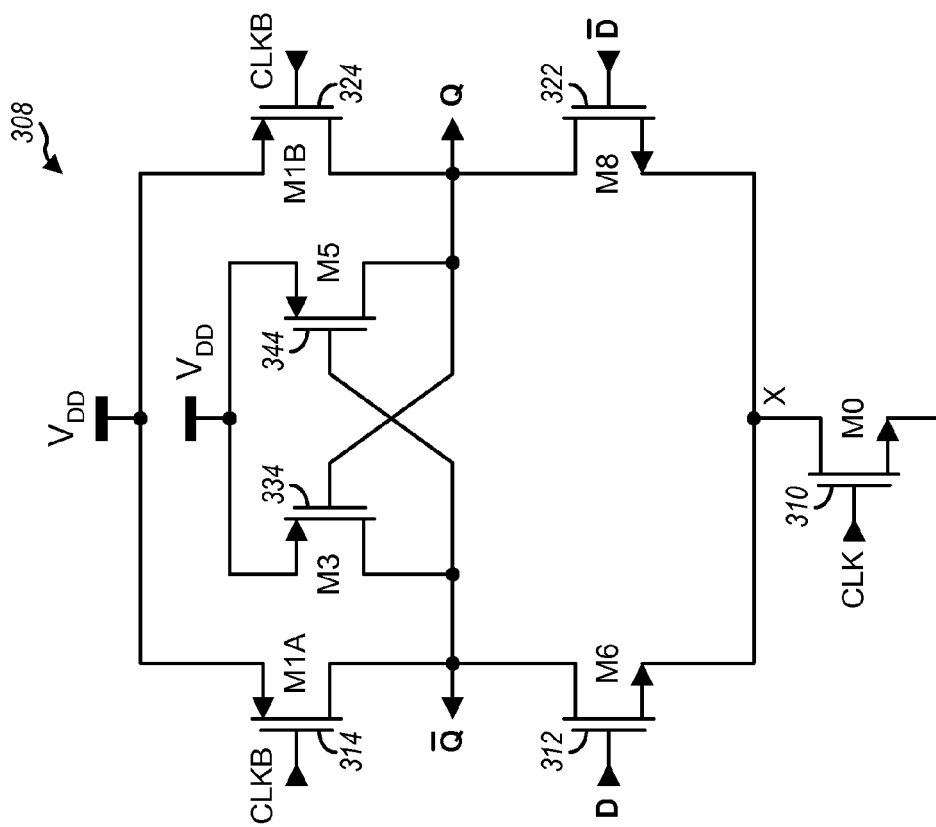
Figure 3D:
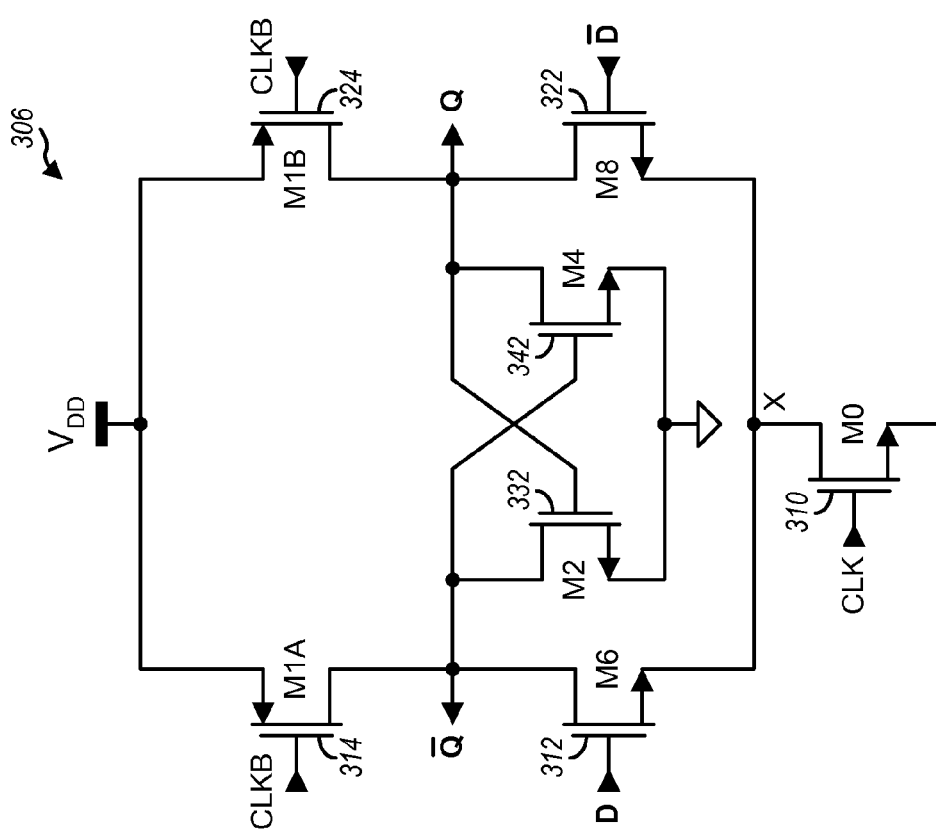

FIG. 3D shows a schematic diagram of a design of a high-speed low-power latch 306. Latch 306 includes all MOS transistors in latch 302 in FIG. 3B except for PMOS transistors 334 and 344, which are omitted in latch 306.

Latch 306 includes the following three sets of transistors:
A first set of pull-down transistor M0 and pull-up transistors M1A and M1B,
A second set of switching transistors M6 and M8, and
A third set of latching transistors M2 and M4.

Latch 306 operates in similar manner as latch 302 in FIG. 3B. During the tracking mode, latching transistors M2 and M4 can provide amplification for high-to-low transition. During the holding mode, the latching transistors maintain the Q and $\overline{Q}$ outputs in accordance with the captured data value.

FIG. 3E shows a schematic diagram of a design of a high-speed low-power latch 308. Latch 308 includes all MOS transistors in latch 302 in FIG. 3B except for NMOS transistors 332 and 342, which are omitted in latch 308.

Latch 308 includes the following three sets of transistors:
A first set of pull-down transistor M0 and pull-up transistors M1A and M1B,
A second set of switching transistors M6 and M8, and
A third set of latching transistors M3 and M5.

Latch 308 operates in similar manner as latch 302 in FIG. 3B. During the tracking mode, latching transistors M3 and M5 can provide amplification for low-to-high transition. During the holding mode, the latching transistors maintain the Q and $\overline{Q}$ outputs in accordance with the captured data value.

FIGS. 3A through 3E show five example designs of the high-speed low-power latches. These latches can operate at high speed and wide frequency range. Switching transistors M6 to M9 and latching transistors M2 to M5 can operate like switches and may be small MOS transistors. This may then reduce parasitic capacitances on the Q and $\overline{Q}$ outputs and allow the latches to operate at high frequency. These latches can also amplify a non-rail-to-rail clock signal and provide rail-to-rail digital signals with low power consumption. These latches can also provide a differential output signal, which may be required by some applications.

The high-speed low-power latches described herein may be used for various circuits and applications and are well suited for frequency dividers implemented on RF integrated circuits (RFICs). These integrated frequency dividers often require high speed but low power. The high-speed low-power latches can enable a frequency divider to divide a non-rail-to-rail clock signal in frequency and amplify the clock signal. Consequently, these latches can eliminate the need for a voltage level shifter to amplify the non-rail-to-rail clock signal to obtain a rail-to-rail clock signal.

Figure 4:
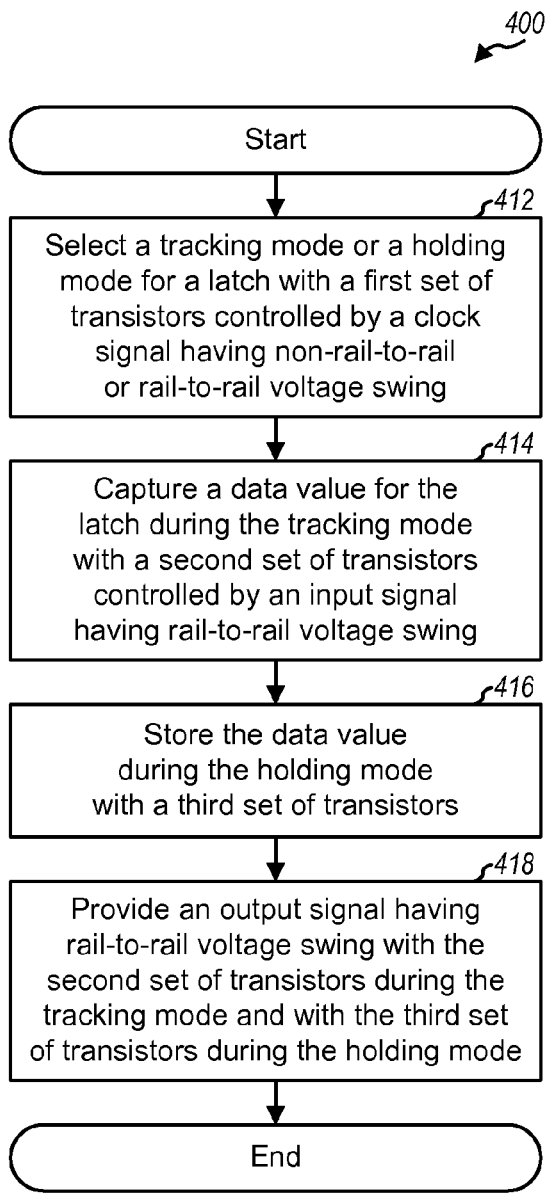
FIG. 4 shows a process for latching an input signal.

FIG. 4 shows a design of a process 400 for latching an input signal. A tracking mode or a holding mode for a latch may be selected with a first set of transistors controlled by a clock signal having non-rail-to-rail or rail-to-rail voltage swing (block 412). A data value for the latch may be captured during the tracking mode with a second set of transistors controlled by an input signal having rail-to-rail voltage swing (block 414). The data value may be stored during the holding mode with a third set of transistors (block 416). An output signal having rail-to-rail voltage swing may be provided with the second set of transistors during the tracking mode and with the third set of transistors during the holding mode (block 418).

In one design, the first set includes at least one pull-down transistor and/or at least one pull-up transistor that may be enabled for the tracking mode or disabled for the holding mode. In one design of block 414, the transistors in the second set may be switched by the input signal to obtain the output signal during the tracking mode, and the output signal may be amplified with the transistors in the third set during the tracking mode.

An output signal from a latch has a duty cycle, which is the percentage of time that the output signal is at logic high in each cycle. It may be desirable to have a duty cycle that is as close to 50% as possible. For example, the output signal from the latch may be used to generate an LO signal, and upconversion or downconversion performance may be adversely impacted by deviations from 50% duty cycle.

In the designs shown in FIGS. 3A through 3E, the settling time during the tracking mode may be varied in order to adjust the duty cycle of the latch output signal. The settling time and hence the duty cycle may be adjusted by performing one or more of the following:

Change the DC level of the complementary clock signals,
Change the $V_{DD}$ supply voltage for pull-up transistors M1, M1A and M1B,
Change the $V_{DD}$ supply voltage for latching transistors M3 and M5,
Change the $V_{SS}$ supply voltage for latching transistors M2 and M4, and
Change the $V_{SS}$ supply voltage for pull-down transistors M0, M0A and M0B.

For clarity, adjustment of the setting time and duty cycle by changing the DC level of the complementary clock signals are described below. The settling time during the tracking mode depends on the strength of the pull-down and pull-up transistors M0 and M1, which in turn is dependent on the bias voltages at the gates of these transistors. The gate bias voltages may be set by the DC level of the complementary clock signals. Thus, by tuning the DC level of the complementary clock signals provided to the gates of the pull-down and pull-up transistors, the rising and falling edges of the complementary output signals at the Q and $\overline{Q}$ outputs may be tuned correspondingly. For example, if the DC level is increased, then the pull-down transistor M0 will become stronger, and the falling edge of the complementary output signals will become faster, and the duty cycle will decrease. The converse is true if the DC level is decreased.

In another aspect, the duty cycle of an output signal from a latch may be automatically adjusted with a feedback loop to achieve 50% duty cycle. In one design, the feedback loop senses the duty cycle of a feedback signal derived from the output signal and generates a bias voltage. The DC level of the clock signal is varied by the bias voltage such that the duty cycle can be adjusted to be approximately 50%.

Figure 5:
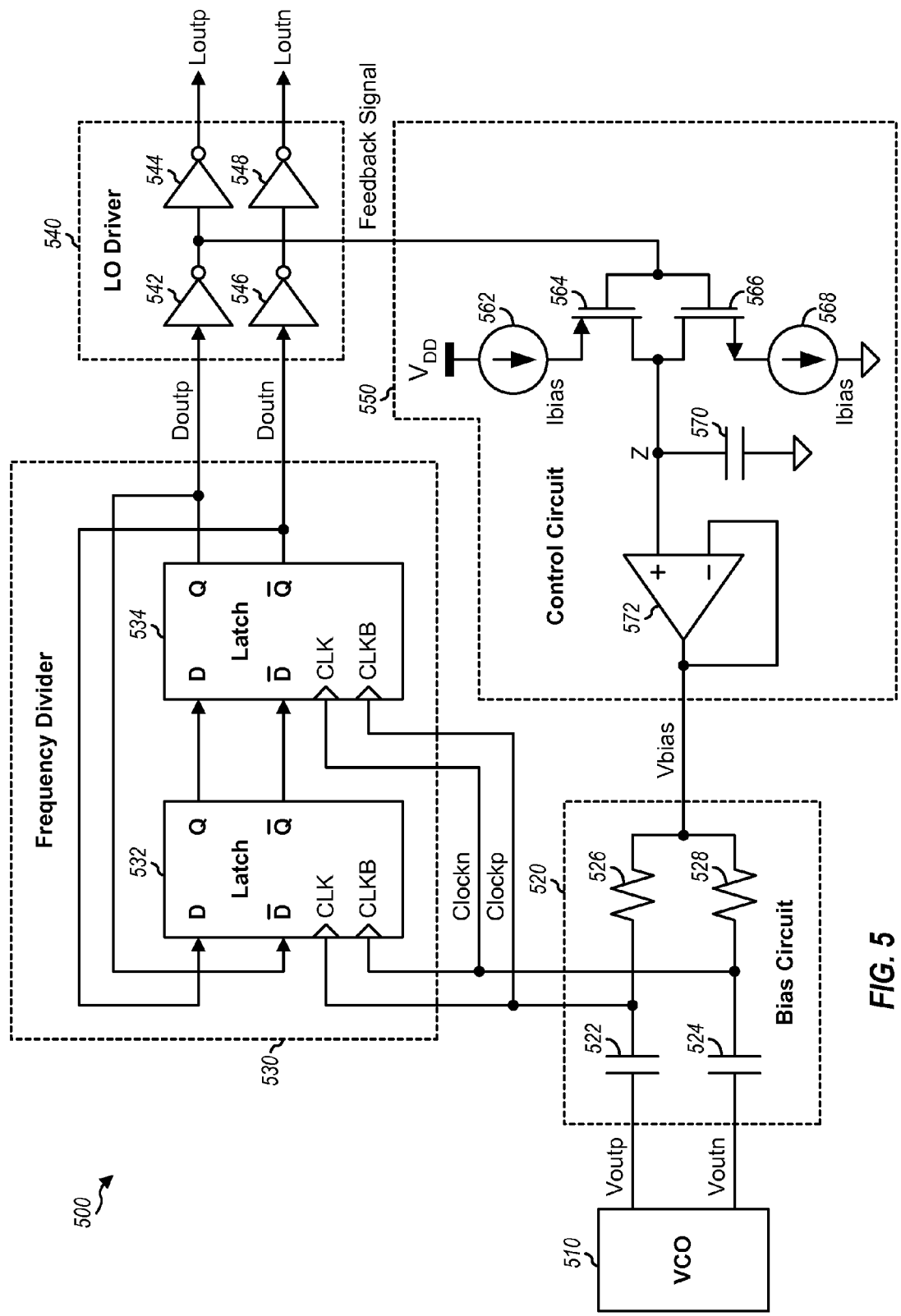
FIG. 5 shows a block diagram of an LO signal generator with automatic duty cycle adjustment.

FIG. 5 shows a block diagram of a design of an LO signal generator 500 with automatic duty cycle adjustment. In this design, LO signal generator 500 includes a VCO 510, a bias circuit 520, a frequency divider 530, an LO driver 540, and a control circuit 550.

VCO 510 generates a differential VCO signal composed of Voutp and Voutn signals at a frequency of $f_0$. Bias circuit 520 receives the differential VCO signal and provides a differential clock signal composed of Clockp and Clockn signals. Within bias circuit 520, AC coupling capacitors 522 and 524 receive the Voutp and Voutn signals at a first end and provide the Clockp and Clockn signals at a second end. Resistors 526 and 528 have one end coupled to the second end of capacitors 522 and 524, respectively, and the other end receiving a bias voltage, Vbias.

Frequency divider 530 divides the clock signal by two in frequency and provides a differential divider signal composed of Doutp and Doutn signals at a frequency of $f_0/2$. Frequency divider 530 includes two latches 532 and 534 coupled in series. Latch 532 has its CLK and CLKB inputs receiving the Clockp and Clockn signals, respectively, and its D and $\overline{D}$ inputs coupled to the $\overline{Q}$ and Q outputs, respectively, of latch 534. Latch 534 has its CLK and CLKB inputs receiving the Clockn and Clockp signals, respectively, and its D and $\overline{D}$ inputs coupled to the Q and $\overline{Q}$ outputs, respectively, of latch 532. Latch 534 provides the Doutp and Doutn signals at its Q and $\overline{Q}$ outputs, respectively. Latches 532 and 534 may each be implemented with latch 300 in FIG. 3A, latch 302 in FIG. 3B, latch 304 in FIG. 3C, latch 306 in FIG. 3D, or latch 308 in FIG. 3E.

LO driver 540 receives the Doutp and Doutn signals from frequency divider 530 and provides a differential LO signal composed of Loutp and Loutn signals. Within LO driver 540, inverters 542 and 544 are coupled in series, with the input of inverter 542 receiving the Doutp signal and the output of inverter 544 providing the Loutp signal. Inverters 546 and 548 are coupled in series, with the input of inverter 546 receiving the Doutn signal and the output of inverter 548 providing the Loutn signal.

Control circuit 550 senses the duty cycle of a feedback signal and generates the bias voltage such that the duty cycle of the feedback signal is approximately 50%. In general, the feedback signal may be derived based on the divider signal, the LO signal, etc. In the design shown in FIG. 5, a P-MOS transistor 564 and an NMOS transistor 566 have their gates coupled together and receiving the feedback signal and their drains coupled together and to node Z. A current source 562 is coupled between the $V_{DD}$ supply and the source of PMOS transistor 564. A current source 568 is coupled between the source of NMOS transistor 566 and circuit ground. A capacitor 570 is coupled between node Z and circuit ground. A unity gain buffer 572 has its non-inverting input coupled to node Z, its inverting input coupled to its output, and its output providing the bias voltage.

The automatic duty cycle adjustment operates as follows. Current source 562 provides a sourcing current of Ibias, and current source 568 provides a sinking current of Ibias. If the duty cycle is 50%, then current source 562 charges capacitor 570 for half a cycle, current source 568 discharges capacitor 570 for the other half cycle, and capacitor 570 has a net charge of zero in each cycle. If the duty cycle is greater than 50%, then current source 562 charges capacitor 570 for more than half a cycle, and capacitor 570 has a net positive charge in each cycle. The voltage across capacitor 570 thus increases when the duty cycle is greater than 50% and decreases when the duty cycle is less than 50%. Buffer 572 has a gain of one, and the bias voltage is equal to the voltage across capacitor 570. When the duty cycle is greater than 50%, the bias voltage increases. The higher bias voltage makes the pull-down transistor stronger, which shortens the settling time and reduces the duty cycle. The converse is true when the duty cycle is less than 50%. Control circuit 550 thus changes the bias voltage and hence the common mode voltage of the Clockp and Clockn signals until the feedback signal has 50% duty cycle.

FIG. 5 shows one design of control circuit 550 for generating the bias voltage based on the sensed duty cycle of the feedback signal. In another design, the feedback signal may be buffered and coupled to a lowpass filter, which may provide a filtered signal having a voltage that is proportional to the duty cycle of the feedback signal. A comparator may then compare the filtered signal against a reference voltage and may generate the bias voltage based on the comparison result. The bias voltage may also be generated in other manners. A common bias voltage may be generated for both the Clockp and Clockn signals, as shown in FIG. 5. Alternatively, different bias voltages may be generated for the Clockp and Clockn signals.

As noted above, the duty cycle may also be adjusted by changing the $V_{DD}$ supply voltage for the pull-up or latching transistors or by changing the $V_{SS}$ supply voltage for the pull-down or latching transistors. A control circuit may sense the duty cycle of the feedback signal and may vary the $V_{DD}$ or $V_{SS}$ supply voltage accordingly.

Figure 6:
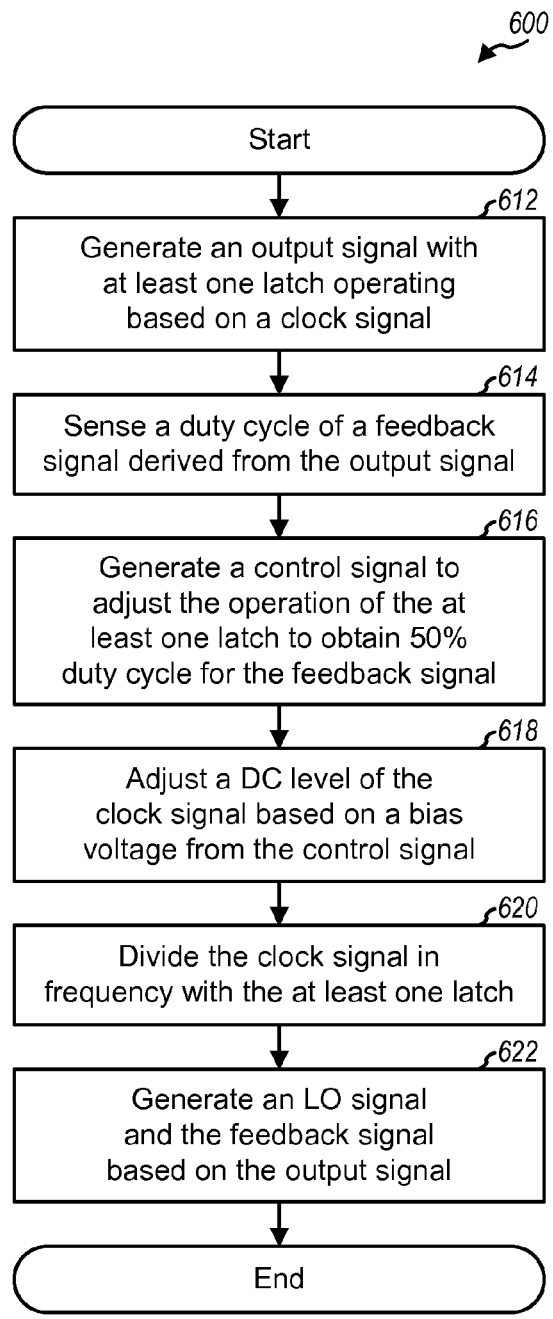
FIG. 6 shows a process for performing automatic duty cycle adjustment.

FIG. 6 shows a design of a process 600 for performing automatic duty cycle adjustment. An output signal may be generated with at least one latch operating based on a clock signal (block 612). A duty cycle of a feedback signal derived from the output signal may be sensed (block 614). A control signal may be generated to adjust the operation of the at least one latch to obtain 50% duty cycle for the feedback signal (block 616). The control signal may comprise a bias voltage, a supply voltage, etc. In one design of block 616, a capacitor may be charged during a first logic level of the feedback signal and discharged during a second logic level of the feedback signal. A bias voltage may be generated based on the voltage across the capacitor. In one design, a DC level of the clock signal may be adjusted based on the bias voltage from the control signal (block 618). In other designs, the upper or lower supply voltage for at least one transistor may be adjusted.

The clock signal may be divided in frequency with the at least one latch, and the output signal may have a frequency that is a fraction of the frequency of the clock signal (block 620). An LO signal and the feedback signal may be generated based on the output signal (block 622).

The high-speed low-power latches described herein may be used for various systems and applications such as communication, networking, computing, etc. The use of the latches in a wireless communication device is described below.

Figure 7:
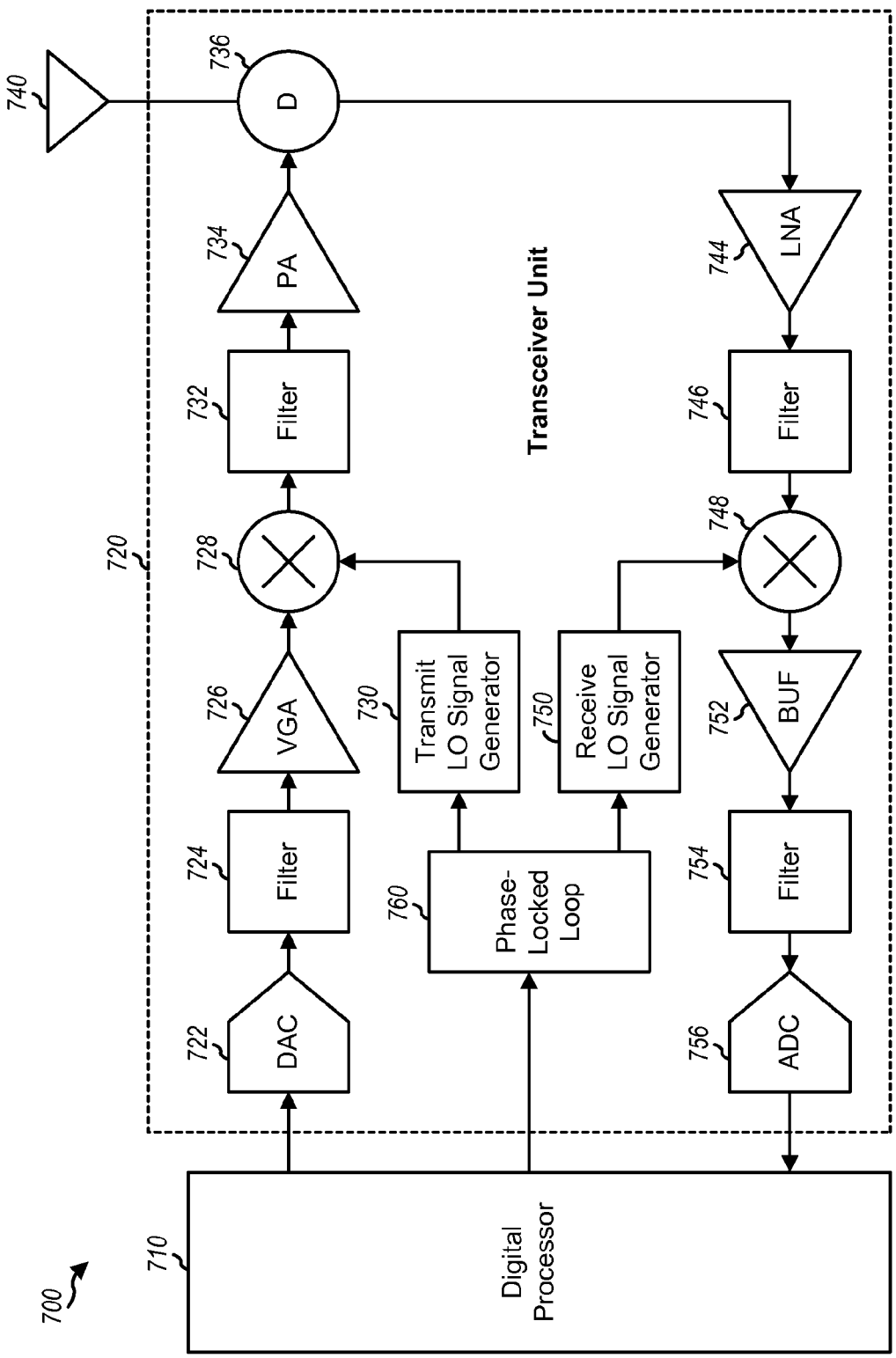
FIG. 7 shows a block diagram of a wireless communication device.

FIG. 7 shows a block diagram of a wireless device 700 that may be used for wireless communication. Wireless device 700 may be a cellular phone, a personal digital assistant (PDA), a terminal, a handset, a wireless modem, a laptop computer, etc. Wireless device 700 is capable of providing bi-directional communication via a transmit path and a receive path.

In the transmit path, a digital processor 710 may process data to be transmitted and provide one or more streams of chips to a transceiver unit 720. Within transceiver unit 720, one or more digital-to-analog converters (DACs) 722 may convert the one or more streams of chips to one or more analog signals. The analog signal(s) may be filtered by a filter 724, amplified by a variable gain amplifier (VGA) 726, and frequency upconverted from baseband to RF by a mixer 728 to generate an upconverted signal. The frequency upconversion may be performed based on an LO signal from a transmit LO signal generator 730. The upconverted signal may be filtered by a filter 732, amplified by a power amplifier (PA) 734, routed through a duplexer (D) 736, and transmitted via an antenna 740.

In the receive path, an RF signal may be received by antenna 740, routed through duplexer 736, amplified by a low noise amplifier (LNA) 744, filtered by a filter 746, and frequency downconverted from RF to baseband by a mixer 748 with an LO signal from a receive LO signal generator 750. The downconverted signal from mixer 748 may be buffered by a buffer (BUF) 752, filtered by a filter 754, and digitized by one or more analog-to-digital converters (ADCs) 756 to obtain one or more streams of samples. The sample stream(s) may be provided to digital processor 710 for processing.

FIG. 7 shows a specific transceiver design. In general, the signal conditioning for each path may be performed with one or more stages of amplifier, filter, and mixer. FIG. 7 shows some circuit blocks that may be used for signal conditioning on the transmit and receive paths. The high-speed low-power latches described herein may be used in digital processor 710 and/or transceiver unit 720.

In the design shown in FIG. 7, transceiver unit 720 includes two LO signal generators 730 and 750 for the transmit and receive paths, respectively. LO signal generators 730 and 750 may each be implemented with LO signal generator 500 in FIG. 5 or some other design utilizing the high-speed low-power latches described herein. A phase locked loop (PLL) 760 may receive control information from digital processor 710 and provide controls for VCOs within LO signal generators 730 and 750 to generate LO signals at the proper frequencies.

The high-speed low-power latches described herein may be implemented on an IC, an analog IC, an RFIC, a mixed-signal IC, an application specific integrated circuit (ASIC), a printed circuit board (PCB), an electronics device, etc. The high-speed low-power latches may also be fabricated with various IC process technologies such as CMOS, NMOS, PMOS, bipolar junction transistor (BJT), bipolar-CMOS (BiCMOS), silicon germanium (SiGe), gallium arsenide (GaAs), etc.

An apparatus implementing the high-speed low-power latches described herein may be a stand-alone device or may be part of a larger device. A device may be (i) a stand-alone IC, (ii) a set of one or more ICs that may include memory ICs for storing data and/or instructions, (iii) an RFIC such as an RF receiver (RFR) or an RF transmitter/receiver (RTR), (iv) an ASIC such as a mobile station modem (MSM), (v) a module that may be embedded within other devices, (vi) a receiver, cellular phone, wireless device, handset, or mobile unit, (vii) etc.

In one or more exemplary designs, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

The previous description of the disclosure is provided to enable any person skilled in the art to make or use the disclosure. Various modifications to the disclosure will be readily apparent to those skilled in the art, and the generic principles defined herein may be applied to other variations without departing from the scope of the disclosure. Thus, the disclosure is not intended to be limited to the examples and designs described herein but is to be accorded the widest scope consistent with the principles and novel features disclosed herein.

What is claimed is:

1. An apparatus comprising:
    a non-inverted clock input;
    an inverted clock input;
    a non-inverted data signal input;
    an inverted data signal input;
    a non-inverted output;
    an inverted output;
    a first set of transistors comprising a first pull-up transistor and a first pull-down transistor configured to receive the inverted clock input and the non-inverted clock input, respectively;
    a second set of transistors coupled to the first set of transistors and configured to receive the non-inverted data signal input and the inverted data signal input and provide an inverted output signal at the inverted output and a non-inverted output signal at the non-inverted output, respectively, and wherein the second set of transistors comprises a first transistor having a first transistor drain directly coupled to a first drain of the first set of transistors and to the inverted output; and
    a third set of transistors coupled to the second set of transistors and configured to form a latch.

2. The apparatus of claim 1, wherein:
    the first pull-up transistor is a PMOS transistor comprising a first pull-up transistor source, a first pull-up transistor gate and a first pull-up transistor drain;
    the first pull-up transistor is configured to couple the first pull-up transistor source to a $V_{DD}$ supply, the first pull-up transistor gate to the inverted clock input, and the first pull-up transistor drain to the second set of transistors;
    the first pull-down transistor is an NMOS transistor having a first pull-down transistor source, a first pull-down transistor gate and a first pull-down transistor drain; and
    the first pull-down transistor is configured to couple the first pull-down transistor source to ground, the first pull-down transistor gate to the non-inverted clock input, and the first pull-down transistor drain to the second set of transistors.

3. The apparatus of claim 2, wherein the first set of transistors comprises a second pull-up transistor, wherein:
    the second pull-up transistor is a PMOS transistor comprising a second pull-up transistor source, a second pull-up transistor gate and a second pull-up transistor drain; and
    the second pull-up transistor is configured to couple the second pull-up transistor source to the $V_{DD}$ supply, the second pull-up transistor gate to the inverted clock input, and the second pull-up transistor drain to the second set of transistors.

4. The apparatus of claim 2, wherein the first set of transistors comprises a second pull-down transistor, wherein:
    the second pull-down transistor is an NMOS transistor comprising a second pull-down transistor source, a second pull-down transistor gate and a second pull-down transistor drain; and
    the second pull-down transistor is configured to couple the second pull-down transistor source to ground, the second pull-down transistor gate to the non-inverted clock input, and the second pull-down transistor drain to the second set of transistors.

5. The apparatus of claim 2, wherein the second set of transistors further comprises:
    the first transistor, the first transistor having a first transistor source, and a first transistor gate, wherein the first transistor is configured to couple the first transistor gate to the non-inverted data signal input and the first transistor source to a second drain of the first set of transistors; and
    a second transistor, the second transistor having a second transistor source, a second transistor gate and a second transistor drain, wherein the second transistor is configured to couple the second transistor gate to the inverted data signal input, the second transistor source to the second drain of the first set of transistors and the second transistor drain to a third drain of the first set of transistors and to the non-inverted output.

6. The apparatus of claim 5,
    wherein the first transistor comprises a first PMOS transistor having a first PMOS transistor gate, a first PMOS transistor source, and a first PMOS transistor drain, wherein the first pull-up transistor drain is coupled to the first PMOS transistor source, the first PMOS transistor gate is coupled to the non-inverted data signal input, and the first PMOS transistor drain is coupled to the inverted output; and
    wherein the second transistor comprises a second PMOS transistor having a second PMOS transistor gate, a second PMOS transistor source, and a second PMOS transistor drain, wherein the first pull-up transistor drain is coupled to the second PMOS transistor source, the second PMOS transistor gate is coupled to the inverted data signal input, and the second PMOS transistor drain is coupled to the non-inverted output.

7. The apparatus of claim 2, wherein said latch comprises:
    a third NMOS transistor having a third NMOS transistor gate, a third NMOS transistor source, and a third NMOS transistor drain, wherein the third NMOS transistor gate is coupled to the non-inverted output, the third NMOS transistor drain is coupled to the inverted output, and the third NMOS transistor source is coupled to ground, and
    a fourth NMOS transistor having a fourth NMOS transistor gate, a fourth NMOS transistor source and a fourth NMOS transistor drain, wherein the fourth NMOS transistor gate is coupled to the inverted output, the fourth NMOS transistor drain is coupled to the non-inverted output, and the fourth NMOS transistor source is coupled to ground.

8. The apparatus of claim 2, wherein said latch comprises:
    a third PMOS transistor having a third PMOS transistor gate, a third PMOS transistor source, and a third PMOS transistor drain, wherein the third PMOS transistor gate is coupled to the non-inverted output, the third PMOS transistor drain is coupled to the inverted output, and the third PMOS transistor source is coupled to the $V_{DD}$ supply, and a fourth PMOS transistor having a fourth PMOS transistor gate, a fourth PMOS transistor source and a fourth PMOS transistor drain, wherein the fourth PMOS transistor gate is coupled to the inverted output, the fourth PMOS transistor drain is coupled to the non-inverted output, and the fourth PMOS transistor source is coupled to the $V_{DD}$ supply.

9. The apparatus of claim 2, wherein said latch comprises a first inverter and a second inverter cross-coupled with one another such that a first inverter output is coupled to a second inverter input and provides an inverted output signal at the inverted output and such that a second inverter output is coupled to a first inverter input and provides an non-inverted output signal at the non-inverted output.

10. The apparatus of claim 1, wherein the transistors in the first set have stronger drive strength, when enabled, than the transistors in the third set.

11. The apparatus of claim 1, wherein the third set of transistors is configured to provide amplification during a tracking mode.

12. An integrated circuit comprising:
a non-inverted clock input;
an inverted clock input;
a non-inverted data signal input;
an inverted data signal input;
a non-inverted output;
an inverted output;
a first set of transistors comprising a first pull-up transistor and a first pull-down transistor configured to receive the inverted clock input and the non-inverted clock input, respectively;
a second set of transistors coupled to the first set of transistors and configured to receive the non-inverted data signal input and the inverted data signal input and provide an inverted output signal at the inverted output and a non-inverted output signal at the non-inverted output, respectively, and wherein the second set of transistors comprises a first transistor having a first transistor drain directly coupled to a first drain of the first set of transistors and to the inverted output; and
a third set of transistors coupled to the second set of transistors and configured to form a latch.

13. The integrated circuit of claim 12, wherein:
the first pull-up transistor is a PMOS transistor comprising a first pull-up transistor source, a first pull-up transistor gate and a first pull-up transistor drain;
the first pull-up transistor is configured to couple the first pull-up transistor source to a $V_{DD}$ supply, the first pull-up transistor gate to the inverted clock input, and the first pull-up transistor drain to the second set of transistors;
the first pull-down transistor is an NMOS transistor having a first pull-down transistor source, a first pull-down transistor gate and a first pull-down transistor drain; and
the first pull-down transistor is configured to couple the first pull-down transistor source to ground, the first pull-down transistor gate to a non-inverted clock input, and the first pull-down transistor drain to the second set of transistors.

14. The integrated circuit of claim 13, wherein the second set of transistors further comprises:
the first transistor, the first transistor having a first transistor source, and a first transistor gate, wherein the first transistor is configured to couple the first transistor gate to the non-inverted data signal input and the first transistor source to a second drain of the first set of transistors; and a second transistor, the second transistor having a second transistor source, a second transistor gate and a second transistor drain, wherein the second transistor is configured to couple the second transistor gate to the inverted data signal input, the second transistor source to the second drain of the first set of transistors and the second transistor drain to a third drain of the first set of transistors and to the non-inverted output.

15. The integrated circuit of claim 14,
wherein the first transistor comprises a first PMOS transistor having a first PMOS transistor gate, a first PMOS transistor source, and a first PMOS transistor drain, wherein the first pull-up transistor drain is coupled to the first PMOS transistor source, the first PMOS transistor gate is coupled to the non-inverted data signal input, and the first PMOS transistor drain is coupled to the inverted output; and
wherein the second transistor comprises a second PMOS transistor having a second PMOS transistor gate, a second PMOS transistor source, and a second PMOS transistor drain, wherein the first pull-up transistor drain is coupled to the second PMOS transistor source, the second PMOS transistor gate is coupled to the inverted data signal input, and the second PMOS transistor drain is coupled to the non-inverted output.

16. A method comprising:
selecting a tracking mode or a holding mode for a latch with a first set of transistors controlled by a clock signal having non-rail-to-rail voltage swing, the non-rail-to-rail voltage swing comprising a voltage swing over a fraction of a range between an upper supply voltage and a lower supply voltage;
capturing a data value for the latch during the tracking mode with a second set of transistors controlled by an input signal having rail-to-rail voltage swing, wherein the second set of transistors comprises a first transistor having a first transistor drain directly coupled to a first drain of the first set of transistors and to an inverted output;
storing the data value during the holding mode with a third set of transistors; and
providing an output signal having rail-to-rail voltage swing with the second set of transistors during the tracking mode and with the third set of transistors during the holding mode.

17. The method of claim 16, wherein the selecting the tracking mode or the holding mode comprises enabling or disabling at least one pull-down transistor and at least one pull-up transistor, respectively, in the first set based on the clock signal.

18. The method of claim 16, wherein the capturing the data comprises
switching the transistors in the second set with the input signal to obtain an output signal, and
amplifying the output signal with the transistors in the third set.

19. An apparatus comprising:
means for selecting a tracking mode or a holding mode for a latch based on a clock signal having non-rail-to-rail voltage swing, the non-rail-to-rail voltage swing comprising a voltage swing over a fraction of a range between an upper supply voltage and a lower supply voltage;
means for capturing a data value for the latch during the tracking mode based on an input signal having rail-torail voltage swing, wherein the means for capturing the data comprises means for switching the transistors in a second set of transistors with an input signal to obtain an output signal, and means for amplifying the output signal with the transistors in a third set of transistors, and wherein the second set of transistors comprises a first transistor having a first transistor drain directly coupled to a first drain of a first set of transistors and to an inverted output;

means for storing the data value during the holding mode; and means for providing an output signal having rail-to-rail voltage swing.

20. An apparatus comprising:
multiple latches coupled in series, each of said multiple latches comprising:
  a non-inverted clock input;
  an inverted clock input;
  a non-inverted data signal input;
  an inverted data signal input;
  a non-inverted output;
  an inverted output;
  a first set of transistors comprising a first pull-up transistor and a first pull-down transistor configured to receive the non-inverted clock input and the inverted clock input;
  a second set of transistors coupled to the first set of transistors and configured to receive the non-inverted data signal input and the inverted data signal input and provide the non-inverted output and the inverted output, wherein the second set of transistors comprises a first transistor having a first transistor drain directly coupled to a first drain of the first set of transistors and to the inverted output; and
  a third set of transistors coupled to the second set of transistors and configured to form a cross coupled latch, wherein each of the multiple latches is configured to receive non-inverted and inverted clock signals from the non-inverted clock input and inverted clock input, each having non-rail-to-rail voltage swing, and a frequency and providing output signals to the inverted output and non-inverted output each having rail-to-rail voltage swing, the apparatus configured to divide the frequency of the non-inverted and inverted clock signals and provide a divider signal having a frequency that is a fraction of the frequency of the non-inverted and inverted clock signals, the non-rail-to-rail voltage swing comprising a voltage swing over a fraction of a range between an upper supply voltage and a lower supply voltage.

21. The apparatus of claim 20, wherein the multiple latches comprise two latches coupled in series configured to divide the non-inverted and inverted clock signals in frequency by a factor of two and to provide the divider signal having a frequency that is one half of the frequency of the non-inverted and inverted clock signals.

22. The apparatus of claim 20, wherein each of the multiple latches is configured to receive a differential clock signal and a differential input signal and to provide a differential output signal.

23. The apparatus of claim 5,
wherein the first transistor comprises a first NMOS transistor having a first NMOS transistor gate, a first NMOS transistor source, and a first NMOS transistor drain, wherein the first pull-down transistor drain is coupled to the first NMOS transistor source, the first NMOS transistor gate is coupled to the non-inverted data signal input, and the first NMOS transistor drain is coupled to the inverted output; and wherein the second transistor comprises a second NMOS transistor having a second NMOS transistor gate, a second NMOS transistor source, and a second NMOS transistor drain, wherein the first pull-down transistor drain is coupled to the second NMOS transistor source, the second NMOS transistor gate is coupled to the inverted data signal input, and the second NMOS transistor drain is coupled to the non-inverted output.

24. The apparatus of claim 7, wherein said latch further comprises:
  a third PMOS transistor having a third PMOS transistor gate, a third PMOS transistor source, and a third PMOS transistor drain, wherein the third PMOS transistor gate is coupled to the non-inverted output, the third PMOS transistor drain is coupled to the inverted output, and the third PMOS transistor source is coupled to the $V_{DD}$ supply, and
  a fourth PMOS transistor having a fourth PMOS transistor gate, a fourth PMOS transistor source and a fourth PMOS transistor drain, wherein the fourth PMOS transistor gate is coupled to the inverted output, the fourth PMOS transistor drain is coupled to the non-inverted output, and the fourth PMOS transistor source is coupled to the $V_{DD}$ supply.

25. The apparatus of claim 9, wherein a fourth NMOS transistor and a fourth PMOS transistor form the first inverter and a third NMOS transistor and a third PMOS transistor form the second inverter.

26. The apparatus of claim 1, wherein the second set of transistors are configured to determine a data value for the apparatus during a tracking mode.

27. The apparatus of claim 2, wherein the inverted and non-inverted clock inputs have a non-rail-to-rail voltage swing.

28. The apparatus of claim 2, wherein the inverted and non-inverted clock inputs have a rail-to-rail voltage swing.

29. The apparatus of claim 1, wherein the inverted data signal input and non-inverted data signal input as well as the inverted output and the non-inverted output each has a rail-to-rail voltage swing.

30. The integrated circuit of claim 14,
wherein the first transistor comprises a first NMOS transistor having a first NMOS transistor gate, a first NMOS transistor source, and a first NMOS transistor drain, wherein the first pull-down transistor drain is coupled to the first NMOS transistor source, the first NMOS transistor gate is coupled to the non-inverted data signal input, and the first NMOS transistor drain is coupled to the inverted output; and wherein the second transistor comprises a second NMOS transistor having a second NMOS transistor gate, a second NMOS transistor source, and a second NMOS transistor drain, wherein the first pull-down transistor drain is coupled to the second NMOS transistor source, the second NMOS transistor gate is coupled to the inverted data signal input, and the second NMOS transistor drain is coupled to the non-inverted output.

31. The integrated circuit of claim 13, wherein the third set of transistors comprises:
  a third NMOS transistor having a third NMOS transistor gate, a third NMOS transistor source, and a third NMOS transistor drain, wherein the third NMOS transistor gate is coupled to the non-inverted output, the third NMOS transistor drain is coupled to the inverted output, and the third NMOS transistor source is coupled to ground, and a fourth NMOS transistor having a fourth NMOS transistor gate, a fourth NMOS transistor source and a fourth NMOS transistor drain, wherein the fourth NMOS transistor gate is coupled to the inverted output, the fourth NMOS transistor drain is coupled to the non-inverted output, and the fourth NMOS transistor source is coupled to ground.

32. The integrated circuit of claim 31, wherein the third set of transistors further comprises:

a third PMOS transistor having a third PMOS transistor gate, a third PMOS transistor source, and a third PMOS transistor drain, wherein the third PMOS transistor gate is coupled to the non-inverted output, the third PMOS transistor drain is coupled to the inverted output, and the third PMOS transistor source is coupled to the $V_{DD}$ supply, and a fourth PMOS transistor having a fourth PMOS transistor gate, a fourth PMOS transistor source and a fourth PMOS transistor drain, wherein the fourth PMOS transistor gate is coupled to the inverted output, the fourth PMOS transistor drain is coupled to the non-inverted output, and the fourth PMOS transistor source is coupled to the $V_{DD}$ supply.

33. The integrated circuit of claim 13, wherein said latch comprises a first inverter and a second inverter cross-coupled with one another such that a first inverter output is coupled to a second inverter input and provides an inverted output signal at the inverted output and such that a second inverter output is coupled to a first inverter input and provides an non-inverted output signal at the non-inverted output.

34. The apparatus of claim 19, wherein the means for selecting the tracking mode or the holding mode comprises means for enabling or disabling at least one pull-down transistor and at least one pull-up transistor, respectively, in the first set based on the clock signal.

35. An apparatus comprising:
a non-inverted clock input;
an inverted clock input;
a non-inverted data signal input;
an inverted data signal input;
a non-inverted output;
an inverted output;
a first set of transistors comprising means for selecting a tracking mode or a holding mode for a latch based on the non-inverted clock input and inverted clock input having a non-rail-to-rail or rail-to-rail voltage swing;
a second set of transistors coupled to the first set of transistors and comprising means for capturing a data value based on the non-inverted data signal input and inverted data signal input, and providing a non-inverted output signal at the non-inverted output and an inverted output signal at the inverted output during the tracking mode, wherein the non-inverted data signal input and inverted data signal input as well as the non-inverted output and inverted output having a rail-to-rail voltage swing, and wherein the second set of transistors comprises a first transistor having a first transistor drain directly coupled to a first drain of the first set of transistors and to the inverted output; and
a third set of transistors coupled to the second set of transistors and comprising means for storing the data value and providing a non-inverted output signal at the non-inverted output and inverted output signal at the inverted output during the holding mode.

36. The apparatus of claim 35 wherein said means for selecting a tracking mode or a holding mode for a latch comprises a first pull-up transistor and a first pull-down transistor configured to receive the inverted clock input and the non-inverted clock input, respectively.

37. The apparatus of claim 36, wherein:
the first pull-up transistor is a PMOS transistor comprising a first pull-up transistor source, a first pull-up transistor gate and a first pull-up transistor drain;
the first pull-up transistor is configured to couple the first pull-up transistor source to a $V_{DD}$ supply, the first pull-up transistor gate to the inverted clock input, and the first pull-up transistor drain to the second set of transistors;
the first pull-down transistor is an NMOS transistor having a first pull-down transistor source, a first pull-down transistor gate and a first pull-down transistor drain; and
the first pull-down transistor is configured to couple the first pull-down transistor source to ground, the first pull-down transistor gate to the non-inverted clock input, and the first pull-down transistor drain to the second set of transistors.

38. The apparatus of claim 37, wherein said means for selecting a tracking mode or a holding mode for a latch further comprises a second pull-up transistor, wherein:
the second pull-up transistor is a PMOS transistor comprising a second pull-up transistor source, a second pull-up transistor gate and a second pull-up transistor drain; and
the second pull-up transistor is configured to couple the second pull-up transistor source to the $V_{DD}$ supply, the second pull-up transistor gate to the inverted clock input, and the second pull-up transistor drain to the second set of transistors.

39. The apparatus of claim 37, wherein the means for selecting a tracking mode or a holding mode for a latch further comprises a second pull-down transistor, wherein:
the second pull-down transistor is an NMOS transistor comprising a second pull-down transistor source, a second pull-down transistor gate and a second pull-down transistor drain; and
the second pull-down transistor is configured to couple the second pull-down transistor source to ground, the second pull-down transistor gate to the non-inverted clock input, and the second pull-down transistor drain to the second set of transistors.

40. The apparatus of claim 37, wherein the second set of transistors further comprises:
the first transistor, the first transistor having a first transistor source, and a first transistor gate wherein the first transistor is configured to couple the first transistor gate to the non-inverted data signal input and the first transistor source to a second drain of the first set of transistors; and
a second transistor, the second transistor having a second transistor source, a second transistor gate and a second transistor drain, wherein the second transistor is configured to couple the second transistor gate to the inverted data signal input, the second transistor source to the second drain of the first set of transistors and the second transistor drain to a third drain of the first set of transistors and to the non-inverted output.

41. The apparatus of claim 40, wherein said means for capturing a data value based on the non-inverted data signal input and inverted data signal input and providing the non-inverted output signal at the non-inverted output and inverted output signal at the inverted output during the tracking mode, wherein the first transistor comprises a first PMOS transistor having a first PMOS transistor gate, a first PMOS transistor source, and a first PMOS transistor drain, wherein the first pull-up transistor drain is coupled to the first PMOS transistor source, the first PMOS transistor gate is coupled to the non-inverted data signal input, and the first PMOS transistor drain is coupled to the inverted output; and wherein the second transistor comprises a second PMOS transistor having a second PMOS transistor gate, a second PMOS transistor source, and a second PMOS transistor drain, wherein the first pull-up transistor drain is coupled to the second PMOS transistor source, the second PMOS transistor gate is coupled to the inverted data signal input, and the second PMOS transistor drain is coupled to the non-inverted output.

42. The apparatus of claim 40, wherein said means for capturing a data value based on the non-inverted data signal input and inverted data signal input and providing the non-inverted output signal at the non-inverted output and inverted output signal at the inverted output during the tracking mode, wherein the first transistor comprises a first NMOS transistor having a first NMOS transistor gate, a first NMOS transistor source, and a first NMOS transistor drain, wherein the first pull-down transistor drain is coupled to the first NMOS transistor source, the first NMOS transistor gate is coupled to the non-inverted data signal input, and the first NMOS transistor drain is coupled to the inverted output; and wherein the second transistor comprises a second NMOS transistor having a second NMOS transistor gate, a second NMOS transistor source, and a second NMOS transistor drain, wherein the first pull-down transistor drain is coupled to the second NMOS transistor source, the second NMOS transistor gate is coupled to the inverted data signal input, and the second NMOS transistor drain is coupled to the non-inverted output.

43. The apparatus of claim 37, wherein the means for storing the data value and providing the non-inverted output signal at the non-inverted output and inverted output signal at the inverted output during the holding mode comprises:

a first inverter and a second inverter cross-coupled with one another such that a first inverter output is coupled to a second inverter input and provides the inverted output signal at the inverted output and such that a second inverter output is coupled to a first inverter input and provides the non-inverted output signal at the non-inverted output.

44. The apparatus of claim 37, wherein the means for storing the data value and providing the non-inverted output signal at the non-inverted output and inverted output signal at the inverted output during the holding mode comprises:

a third NMOS transistor having a third NMOS transistor gate, a third NMOS transistor source, and a third NMOS transistor drain, wherein the third NMOS transistor gate is coupled to the non-inverted output, the third NMOS transistor drain is coupled to the inverted output, and the third NMOS transistor source is coupled to ground, and a fourth NMOS transistor having a fourth NMOS transistor gate, a fourth NMOS transistor source and a fourth NMOS transistor drain, wherein the fourth NMOS transistor gate is coupled to the inverted output, the fourth NMOS transistor drain is coupled to the non-inverted output, and the fourth NMOS transistor source is coupled to ground.

45. The apparatus of claim 37, wherein the means for storing the data value and providing the non-inverted output signal at the non-inverted output and inverted output signal at the inverted output during the holding mode comprises:

a third PMOS transistor having a third PMOS transistor gate, a third PMOS transistor source, and a third PMOS transistor drain, wherein the third PMOS transistor gate is coupled to the non-inverted output, the third PMOS transistor drain is coupled to the inverted output, and the third PMOS transistor source is coupled to the $V_{DD}$ supply, and a fourth PMOS transistor having a fourth PMOS transistor gate, a fourth PMOS transistor source and a fourth PMOS transistor drain, wherein the fourth PMOS transistor gate is coupled to the inverted output, the fourth PMOS transistor drain is coupled to the non-inverted output, and the fourth PMOS transistor source is coupled to the $V_{DD}$ supply.

46. The apparatus of claim 44, wherein the means for storing the data value and providing the non-inverted output signal at the non-inverted output and inverted output signal at the inverted output during the holding mode further comprises:

a third PMOS transistor having a third PMOS transistor gate, a third PMOS transistor source, and a third PMOS transistor drain, wherein the third PMOS transistor gate is coupled to the non-inverted output, the third PMOS transistor drain is coupled to the inverted output, and the third PMOS transistor source is coupled to the $V_{DD}$ supply, and a fourth PMOS transistor having a fourth PMOS transistor gate, a fourth PMOS transistor source and a fourth PMOS transistor drain, wherein the fourth PMOS transistor gate is coupled to the inverted output, the fourth PMOS transistor drain is coupled to the non-inverted output, and the fourth PMOS transistor source is coupled to the $V_{DD}$ supply.

47. An integrated circuit comprising:
a non-inverted clock input;
an inverted clock input;
a non-inverted data signal input;
an inverted data signal input;
a non-inverted output;
an inverted output;
a first set of transistors comprising a first pull-up transistor, a second pull-up transistor and a first pull-down transistor configured to receive the inverted clock input, the inverted clock input and the non-inverted clock input, respectively, wherein:
the first pull-up transistor is a PMOS transistor comprising a first pull-up transistor source, a first pull-up transistor gate and a first pull-up transistor drain;
the second pull-up transistor is a PMOS transistor comprising a second pull-up transistor source, a second pull-up transistor gate and a second pull-up transistor drain;
the first pull-up transistor is configured to couple the first pull-up transistor source to a $V_{DD}$ supply, the first pull-up transistor gate to the inverted clock input, and the first pull-up transistor drain to a second set of transistors;
the second pull-up transistor is configured to couple the second pull-up transistor source to the $V_{DD}$ supply, the second pull-up transistor gate to the inverted clock input, and the second pull-up transistor drain to a second set of transistors;
the first pull-down transistor is an NMOS transistor having a first pull-down transistor source, a first pull-down transistor gate and a first pull-down transistor drain; and the first pull-down transistor is configured to couple the first pull-down transistor source to ground, the first pull-down transistor gate to a non-inverted clock input, and the first pull-down transistor drain to a second set of transistors;

a second set of transistors coupled to the first set of transistors configured to receive the non-inverted data signal input and the inverted data signal input and provide an inverted output signal at the inverted output and a non-inverted output signal at the non-inverted output, wherein the second set of transistors comprises:

a first transistor, the first transistor having a first transistor source, a first transistor gate, and a first transistor drain, wherein the first transistor is configured to directly couple the first transistor gate to the non-inverted data signal input, the first transistor source to the first pull-down transistor drain and the first transistor drain to the first pull-up transistor drain and to the inverted output; and a second transistor, the second transistor having a second transistor source, a second transistor gate and a second transistor drain, wherein the second transistor is configured to couple the second transistor gate to the inverted data signal input, the second transistor source to the first pull-down transistor drain and the second transistor drain to the second pull-up transistor drain and to the non-inverted output; and a third set of transistors coupled to the second set of transistors configured to form a first inverter and a second inverter cross-coupled with one another such that a first inverter output is coupled to a second inverter input and provides an inverted output signal at the inverted output and such that a second inverter output is coupled to a first inverter input and provides a non-inverted output signal at the non-inverted output, wherein the third set of transistors comprises:

a third NMOS transistor having a third NMOS transistor gate, a third NMOS transistor source, and a third NMOS transistor drain, wherein the third NMOS transistor gate is coupled to the non-inverted output, the third NMOS transistor drain is coupled to the inverted output, and the third NMOS transistor source is coupled to ground without any intervening transistor; and a fourth NMOS transistor having a fourth NMOS transistor gate, a fourth NMOS transistor source, and a fourth NMOS transistor drain, wherein the fourth NMOS transistor gate is coupled to the inverted output, the fourth NMOS transistor drain is coupled to the non-inverted output, and the fourth NMOS transistor source is coupled to ground;

a third PMOS transistor having a third PMOS transistor gate, a third PMOS transistor source, and a third PMOS transistor drain, wherein the third NMOS transistor gate is coupled to the non-inverted output, the third PMOS transistor drain is coupled to the inverted output, and the third PMOS transistor source is coupled to the $V_{DD}$ supply; and a fourth PMOS transistor having a fourth PMOS transistor gate, a fourth PMOS transistor source, and a fourth PMOS transistor drain, wherein the fourth PMOS transistor gate is coupled to the inverted output, the fourth PMOS transistor drain is coupled to the non-inverted output, and the fourth PMOS transistor source is coupled to the $V_{DD}$ supply, the fourth NMOS transistor gate and the fourth PMOS transistor gate being coupled together without any intervening transistor.

* * * * *